United States Patent [19]

Kato et al.

[11] Patent Number: 5,573,976
[45] Date of Patent: Nov. 12, 1996

[54] METHOD OF FABRICATING SEMICONDUCTOR LASER

[75] Inventors: Manabu Kato; Takashi Motoda, both of Itami, Japan

[73] Assignee: Mitsubishi Denki Kabushiki Kaisha, Tokyo, Japan

[21] Appl. No.: 555,417

[22] Filed: Nov. 9, 1995

[30]     Foreign Application Priority Data

Nov. 16, 1994  [JP]  Japan .................................. 6-281816

[51] Int. Cl.$^6$ .................................................. H01L 21/20
[52] U.S. Cl. ................................. 437/129; 148/DIG. 95
[58] Field of Search ..................... 437/129; 148/DIG. 95

[56]                References Cited

U.S. PATENT DOCUMENTS

| | | | |
|---|---|---|---|
| H1264 | 12/1993 | Epler et al. | 437/129 |
| 4,983,541 | 1/1991 | Kumabe | 437/129 |
| 4,987,096 | 1/1991 | Ishikawa et al. | 437/129 |
| 5,087,587 | 2/1992 | Morimoto et al. | 437/129 |
| 5,171,707 | 12/1992 | Takahashi | 437/129 |
| 5,436,192 | 7/1995 | Epler et al. | 437/129 |

FOREIGN PATENT DOCUMENTS

| | | |
|---|---|---|
| 0423535 | 4/1991 | European Pat. Off. . |
| 0472212 | 2/1992 | European Pat. Off. . |

OTHER PUBLICATIONS

Arimoto et al, "150 mW Fundamental–Transverse–Mode Operation of 670 nm Window Laser Diode", IEEE Journal of Quantum Electronics, vol. 29, No. 6, Jun. 1993, pp. 1874–1877.

*Primary Examiner*—Nam Nguyen
*Assistant Examiner*—Linda J. Fleck
*Attorney, Agent, or Firm*—Leydig, Voit & Mayer

[57]                ABSTRACT

A method of fabricating a semiconductor laser includes forming an active layer including a compound semiconductor material on a semiconductor substrate, the compound semiconductor material having an energy band gap that monotonically increases as the growth temperature of the material rises above a certain growth temperature, including growing a window structure forming region including at least a region which serves as a waveguide in the proximity of a laser resonator facet at a higher temperature than a region outside the window structure forming region. Therefore, the band gap energy of the window structure forming region is larger than that of the region outside the window structure forming region. Therefore, a semiconductor laser having a window structure can easily be fabricated with a high yield and with great repeatability.

27 Claims, 21 Drawing Sheets position in resonator length direction

METHOD OF FABRICATING SEMICONDUCTOR LASER

FIELD OF THE INVENTION

The present invention relates to a method of fabricating a semiconductor laser, and more particularly, to a method of fabricating a semiconductor laser having a window structure.

BACKGROUND OF THE INVENTION

In a prior art method of fabricating AlGaInP/GaInP series lasers, efforts are being made to fabricate a semiconductor laser which has a window structure in the proximity of the laser resonator facet, that is, a structure whose energy band gap is widened such that the absorption of the laser light at the laser resonator facets is reduced and the COD (Catastrophic Optical Damage) level is raised, thereby obtaining a semiconductor laser having a high power output and a long lifetime. This window structure is obtained, for example, by disordering a natural superlattice of an active layer by an impurity diffusion in the proximity of the laser resonator facet, thereby widening an energy band gap in the proximity of the laser resonator facet, or by growing crystals which have a wide energy band gap at the laser resonator facet.

FIG. 27(a) is a perspective view showing a structure of a prior art AlGaInP/GaInP series semiconductor laser which has a window structure, and FIG. 27(b) is a cross-sectional view taken along the line 27—27. In the figures, reference numeral 300 designates a semiconductor laser, reference numeral 12 designates an n type GaAs substrate, reference numeral 11 designates an n type AlGaInP cladding layer, reference numeral 10 designates a GaInP active layer, reference numeral 55 designates a window structure, reference numerals 9a and 9b designate p type AlGaInP cladding layers, reference numeral 41 designates a p type GaInP etching stopper layer, reference numeral 8 designates a p type GaInP band discontinuity layer, reference numeral 7a designates a p type GaAs cap layer, reference numeral 7b designates a p type GaAs contact layer, reference numeral 6a designates an n side electrode, reference numeral 6b designates a p side electrode, reference numeral 40 designates an n type GaAs current blocking layer, and reference numeral 3b designates a laser resonator facet.

Furthermore, FIGS. 28(a)–28(d) are perspective views illustrating a prior art method of fabricating a semiconductor laser. In the figures, the same reference numerals used in FIGS. 27(a) and 27(b) designate the same or corresponding parts, and reference numerals 50 and 51 designate a first insulating film and second insulating film, respectively, comprising materials such as SiN or SION.

The fabricating method will be described. First, the n type AlGaInP cladding layer 11, the GaInP active layer 10, the p type AlGaInP cladding layer 9a, the p type GaInP etching stopper layer 41, the p type AlGaInP cladding layer 9b, the p type GaInP band discontinuity layer 8, and the p type GaAs cap layer 7a are epitaxially grown in this order on the n type GaAs substrate 12 by MOCVD (Metal Organic Chemical Vapor Deposition). These epitaxial layers are grown at the temperature of about 650° C. so that the natural superlattice is formed in the active layer 10.

Next, the first insulating film 50 is formed by CVD (Chemical Vapor Deposition) or sputtering on the semiconductor laminated layer structure prepared by MOCVD. Then, a resist is deposited on the insulating film 50, and a portion of the insulating film 50 which becomes the laser resonator facet proximity region is removed by photolithography and dry-etching methods such as RIE (Reactive Ion Etching) or wet-etching with a solution such as buffered hydrofluoric acid. When the length in the resonator length direction of the semiconductor laser 300 is, for example, 650 μm, the portion of the first insulating film 50 from the laser resonator facet to more than 20 μm in the resonator length direction is removed. Next, after the p type GaAs cap layer 7a is selectively etched with the first insulating film 50 as a mask using a tartaric acid based etchant, a ZnO film (not shown in the figure) is grown by CVD or sputtering. Then, Zn is diffused through an opening of the first insulating film 50 and the cap layer 7a by a heat treatment at 550° C. for about one hour until Zn reaches the active layer. This Zn diffusion disorders the natural superlattice of the active layer 10. Consequently, the band gap energy of the portion of the active layer which becomes the laser resonator facet proximity region becomes greater than the band gap energy of the remaining portion of the active layer, thereby forming a window structure 55 in the laser resonator facet proximity region. The ZnO film is removed later (FIG. 28(b)).

Next, the second insulating film 51 is formed on the semiconductor laminated layer structure and patterned into a stripe shape extending in the resonator length direction by photolithography or the like. Then, using this stripe-shaped insulating film 51 as a mask, the p type GaAs cap layer 7a is selectively etched using a tartaric acid based etchant. Next, the p type GaInP band discontinuity layer 8 is etched and removed with a hydrochloric acid based etchant, and the p type AlGaInP cladding layer 9b is etched and removed with sulfuric acid based etchant until the etching front reaches the p type GaInP etching stopper layer 14, thereby forming a ridge structure.

Next, using the second insulating film 51 as a mask, the n type GaAs current blocking layer 40 is selectively grown so as to bury the ridge, and after the first and the second insulating films 51 and 52 are removed, the p type GaAs contact layer 7b is formed on the semiconductor laminated layer structure (FIG. 28(d)). Then, the n side electrode 6b is formed on the p type GaAs contact layer 7b and the p side electrode 6a is formed on the rear surface side of the n type GaAs substrate 12. Finally, by cleaving the semiconductor laminated layer structure at a location where the window structure 55 is formed by diffusing Zn laser resonator facet, the laser resonator facet 3b is formed and the semiconductor laser 300 illustrated in FIG. 27(a) is obtained.

In the prior art semiconductor laser 300 shown in FIGS. 27(a) and 27(b), a dopant impurity such as Zn is diffused in the proximity of the laser resonator facet of the active layer 10 where the natural superlattice is formed so that the natural superlattice in the region diffused with the Zn is disordered and becomes of a mixed crystal having a homogeneous composition, and the energy band gap of this region becomes larger than that of other regions of the active layer 10, thereby making this region diffused with the Zn a window structure 55 where the absorption of light does not take place. In the prior art semiconductor laser 300 having such a window structure at the laser resonator facet 3b, laser light emitted in the active layer 10 is not absorbed at this window structure and catastrophic optical damage (COD) can be avoided.

However, in the prior art method of fabricating a semiconductor laser, a Zn diffusion process is required in order to form a window structure by disordering the active layer in the proximity of the laser resonator facet. This diffusion process is hard to control and it is possible that too much Zn may be accidentally diffused in the proximity of the resonator facet. If too much Zn is diffused, the electrical resistance of the Zn diffused region decreases due to Zn, and leakage current which does not contribute to the laser oscillation is generated in the proximity of the laser resonator facet, i.e., at the window structure 55. This results in an increased threshold current or an increased operation current, and a semiconductor laser having desired characteristics cannot be obtained repeatedly.

FIG. 29(a) is a perspective view showing a structure of another prior art semiconductor laser and FIGS. 29(b) and 29(c) are cross-sectional views taken along the lines 29b—29b and 29c—29c in FIG. 29(a), respectively. This prior art semiconductor laser has an AlGaInP layer whose energy band gap is greater than the energy band gap of the active layer 10 on the laser resonator facet. In FIGS. 29(a), 29(b), and 29(c), the same reference numerals used in FIGS. 27(a) and 27(b) designate the same or corresponding parts. Reference numeral 400 designates a semiconductor laser, reference numeral 3c designates a laser resonator facet, and reference numeral 52 designates the AlGaInP window structure layer.

A method of fabricating this prior art semiconductor laser will be described with reference to FIGS. 29(a)-29(c). First, the n type AlGaInP cladding layer 11, the GaInP active layer 10, the p type AlGaInP cladding layer 9a, the p type GaInP etching stopper layer 41, the p type AlGaInP cladding layer 9b, the p type GaInP band discontinuity layer 8, and the p type GaAs cap layer 7a are epitaxially grown in this order on the n type GaAs substrate 12 by MOCVD. Then, an insulating film (not shown in the figures) comprising materials such as SiN or SiON is formed by CVD or sputtering, and a stripe mask (not shown in the figures) extending in the laser resonator length direction is formed using photolithography techniques or the like. Next, using this stripe mask, the p type GaAs cap layer 7 is selectively etched with a tartaric acid based etchant. Then, the p type GaInP band discontinuity layer 8 is etched with a hydrochloric acid based etchant and the p type AlGaInP cladding layer 9 is etched with a sulfuric acid based etchant until the etching front reaches the p type GaInP etching stopper layer 41, thereby producing a ridge stripe structure. Then, after forming the n type GaAs current blocking layer 40 so as to bury the ridge, the insulating film is removed, the p type GaAs contact layer 7 is formed on the entire surface, and the p side electrode 6b is formed on the p type GaAs contact layer 7 and the n side electrode 6a is formed on the rear surface side of the n type GaAs substrate 12. Then the substrate 12 is cleaved to form the laser resonator facet 3c, and finally the window structure layer 52 comprising, for example, AlGaInP, whose energy band gap is large enough so that the laser light is not absorbed is grown on the laser resonator facet 3c, thereby obtaining the semiconductor laser shown in FIGS. 29(a)-29(c).

Also in the semiconductor laser 400 as the other prior art semiconductor laser, by disposing the window structure layer 52 whose energy band gap is larger than that of the active layer 10 on the laser resonator facet 3c, the laser light in the waveguide of the active layer 10 is not absorbed at this window structure layer 52 and, as a result, catastrophic optical damage at the laser resonator facet 3c can be avoided.

However, although, in a method of fabricating a semiconductor laser such as this, it is necessary to epitaxially grow the window structure layer comprising AlGaInP or the like at the laser resonator facet after the cleavage, since semiconductor lasers after the cleavages are quite delicate, their handling is difficult and there is a possibility that the laser resonator facet may be scratched during handling, thereby decreasing yield. Furthermore, since it is necessary to conduct the epitaxial growth after the cleavage, the fabricating process becomes complicated and productivity is decreased.

As described above, in the prior art method of fabricating a semiconductor laser, by diffusing Zn in the proximity of the laser resonator facet of the active layer and disordering the natural superlattice in the proximity of the laser resonator facet, the band gap in the proximity of the laser resonator facet of the active layer is widened so that the laser light is not absorbed in the proximity of the laser resonator facet, thereby forming the window structure and avoiding catastrophic optical damage. However, since it is difficult to control the diffusion of Zn, there is a possibility, as described above, that too much Zn is diffused in the proximity of the laser resonator facet and leakage current which does not contribute to the laser oscillation is generated in the proximity of the laser resonator facet, resulting in an increased threshold current or an increased operation current, and a semiconductor laser having desired characteristics can not be obtained repeatedly.

In the other prior art method of fabricating a semiconductor laser, although the COD is avoided by disposing the window structure layer having an energy band gap larger than the energy band gap of the active layer on the laser resonator facet, since it is necessary to epitaxially grow the window structure layer on the laser resonator facet of the quite delicate semiconductor laser after the cleavage, its handling becomes difficult, and there is a possibility that the yield is decreased or the productivity is decreased due to the fabricating process which becomes complicated.

SUMMARY OF THE INVENTION

It is an object of the present invention to provide a method of fabricating a semiconductor laser that can produce, without decreasing the yield, a semiconductor laser with a window structure easily and with great repeatability.

Other objects and advantages of the present invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a method of fabricating a semiconductor laser comprises preparing a semiconductor substrate having a front surface and a rear surface; and forming an active layer comprising a compound semiconductor material on the front surface of the semiconductor substrate, the compound semiconductor material having a nature that its energy band gap monotonically increases as a growth temperature rises above a certain growth temperature as it grows, the step of forming growing the active layer being conducted at a temperature above the certain growth temperature, and the active layer being grown such that a window structure forming region including at least a region which serves as a waveguide in the proximity of the laser resonator facet becomes at a higher temperature than a region other than the window structure forming region and, therefore, an energy band gap of the window structure forming region becomes larger than that of the region other than the window structure forming region. Therefore, without conducting the diffusion of Zn or the like which has poor controllability, a semiconductor laser having a window structure and prescribed characteristics can be obtained with good repeatability, and since the window structure can be formed during the formation of the active layer, a process of forming a window structure after the cleavage does not have to be conducted and a semiconductor laser having a window structure can easily be obtained without reducing the yield.

According to a second aspect of the present invention, in the method of fabricating a semiconductor laser described as the first aspect of the present invention, the active layer comprises GaInP. Therefore, a semiconductor laser having a window structure can easily be provided with good repeatability without reducing the yield.

According to a third aspect of the present invention, in the method of fabricating a semiconductor laser described as the first aspect of the present invention, the step of forming an active layer is conducted while the window structure forming region of the active layer is irradiated with laser light so that the window structure forming region is heated to a temperature higher than that in the region of the active layer other than the window structure forming region. Therefore, a semiconductor laser having a window structure can easily be provided with good repeatability without reducing the yield.

According to a fourth aspect of the present invention, in the method of fabricating a semiconductor laser described as the third aspect of the present invention, a plane shape of an irradiation region of the laser light is a point shape; and the irradiation of the laser light is conducted by scanning the point shape laser light along the window structure forming region. Therefore, a semiconductor laser having a window structure can easily be provided with good repeatability without reducing the yield.

According to a fifth aspect of the present invention, in the method of fabricating a semiconductor laser described as the fourth aspect of the present invention, a scanning cycle of the laser light is equal to or less than the time needed for the active layer to grow by one monolayer. Therefore, the window structure can be formed in the window structure forming region while uniformly heating the growth surface by each monolayer, and the energy band gap of the window structure can be made uniform, thereby providing a semiconductor laser having better characteristics.

According to a sixth aspect of the present invention, in the method of fabricating a semiconductor laser described as the third aspect of the present invention, a plane shape of an irradiation region of the laser light is the same as the plane shape of the window structure forming region; and the irradiation of the laser light is conducted such that the irradiation region of the laser light is superimposed on the window structure forming region. Therefore, the scanning mechanism of the laser device which emits the laser light becomes unnecessary, and a semiconductor laser can be formed by using inexpensive laser device of a simple structure.

According to a seventh aspect of the present invention, in the method of fabricating a semiconductor laser described as the first aspect of the present invention, the step of forming the active layer is conducted while the window structure forming region of the active layer is irradiated with light such that the window structure forming region is heated to a temperature higher than that in the region of the active layer other than the window structure forming region. Therefore, a semiconductor laser having a window structure can easily be provided with good repeatability without reducing the yield.

According to an eighth aspect of the present invention, the method of fabricating a semiconductor laser described as the first aspect of the present invention further comprises forming a recess by removing by etching the rear surface side of the window structure forming region of the semiconductor substrate to a prescribed depth; filling the recess with a material having thermal conductivity higher than that of the semiconductor substrate, thereby forming a high thermal conductivity layer; the steps of forming and filling the recess being conducted before the step of forming the active layer; and the growth of the active layer being conducted using a substrate heating type MOCVD (metal organic chemical vapor deposition) apparatus which heats the semiconductor substrate by a heating body from the rear surface side. Therefore, using the prior art substrate heating type MOCVD apparatus, by improving the thermal conduction to the growth surface in the window structure forming region, the window structure can be formed in the active layer while the growth temperature in the window structure forming region is raised, and a semiconductor laser having a window structure can easily be formed.

According to a ninth aspect of the present invention, the method of fabricating a semiconductor laser described as the first aspect of the present invention further comprises forming a recess by removing by etching the rear surface side of the region of the semiconductor substrate other than the window structure forming region to a prescribed depth before the step of forming the active layer; and the growth of the active layer being conducted using a substrate heating type MOCVD apparatus which heats the semiconductor substrate by a heating body from the rear surface side. Therefore, using the prior art substrate heating type MOCVD apparatus, by reducing the thermal conduction to the growth surface in the region other than the window structure forming region, the window structure can be formed in the active layer while the growth temperature in the window structure forming region is raised, and a semiconductor laser having a window structure can easily be formed.

According to a tenth aspect of the present invention, the method of fabricating a semiconductor laser described as the ninth aspect of the present invention further comprises filling the recess with a material having thermal conductivity lower than that of the semiconductor substrate after the step of forming the recess, thereby forming a low thermal conductivity layer. Therefore, using the prior art substrate heating type MOCVD apparatus, by reducing the thermal conduction to the growth surface in the region other than the window structure forming region, the window structure can be formed in the active layer while the growth temperature in the window structure forming region is raised, and a semiconductor laser having a window structure can easily be formed.

According to an eleventh aspect of the present invention, the method of fabricating a semiconductor laser described as the first aspect of the present invention further comprises forming a recess by removing by etching the rear surface side of the window structure forming region of the semiconductor substrate to a prescribed depth; forming a low reflectivity film having reflectivity lower than that of the semiconductor substrate on the bottom surface of the recess; the steps of forming the recess and the low reflectivity film being conducted before the step of forming the active layer; and the growth of the active layer being conducted using a substrate heating type MOCVD apparatus which heats the semiconductor substrate by a light source from the rear surface side. Therefore, using the prior art substrate heating type MOCVD apparatus, by improving the absorption of heat in the window structure forming region, the window structure can be formed in the active layer while the growth temperature in the window structure forming region is raised, and a semiconductor laser having a window structure can easily be formed.

According to a twelfth aspect of the present invention, the method of fabricating a semiconductor laser described as the first aspect of the present invention further comprises forming a recess by removing by etching the rear surface side of the region of the semiconductor substrate other than the window structure forming region to a prescribed depth; forming a high reflectivity film having reflectivity higher than that of the semiconductor substrate on the bottom surface of the recess; the steps of forming the recess and the high reflectivity film being conducted before the step of forming the active layer; and the growth of the active layer being conducted using a substrate heating type MOCVD apparatus which heats the semiconductor substrate by a light source from the rear surface side. Therefore, using the prior art substrate heating type MOCVD apparatus, by reducing the absorption of heat in the region other than the window structure forming region, the window structure can be formed in the active layer while the growth temperature in the window structure forming region is raised, and a semiconductor laser having a window structure can easily be formed.

According to a thirteenth aspect of the present invention, the method of fabricating a semiconductor laser described as the first aspect of the present invention further comprises forming a conductivity type inversion region having a conductivity opposite to that of the semiconductor substrate by introducing an impurity to a prescribed depth into the window structure forming region of the semiconductor substrate; and the step of forming the active layer being conducted such that the window structure forming region of the active layer is heated to a temperature higher than that in the region of the active layer other than the window structure forming region by heat which is generated in the conductivity inversion region by current flowing therein. Therefore, a semiconductor laser having a window structure can easily be provided with good repeatability without reducing the yield, and leak current which flows in the region where the window structure of the semiconductor laser can be reduced.

According to a fourteenth aspect of the present invention, in the method of fabricating a semiconductor laser described as the first aspect of the present invention, the semiconductor substrate constitutes a part of a wafer having a front surface; the method of fabricating a semiconductor laser further comprises the step of forming a marker for alignment in a region on the front surface of the wafer not including the semiconductor substrate; and the alignment in subsequent steps after the step of forming the active layer is conducted using the marker. Therefore, the precision in positioning the region where the window structure is formed can be improved and the yield of the semiconductor laser can be improved.

According to a fifteenth aspect of the present invention, a method of fabricating a semiconductor laser comprises preparing a semiconductor substrate having a front surface and a rear surface; and forming an active layer comprising a compound semiconductor material on the front surface of the semiconductor substrate, the compound semiconductor material having a nature that its energy band gap monotonically decreases as a growth temperature rises below a certain growth temperature as it grows, the step of forming the active layer being conducted at a temperature below the certain growth temperature, and the active layer being grown such that an active region including at least a region serving as a light emitting region which contributes to light emission but not including a region serving as a waveguide in a laser resonator facet proximity region becomes at a higher temperature than a region other than the active region, therefore, an energy band gap of the active region becomes smaller than that of the region other than the active region. Therefore, without conducting the diffusion of Zn or the like which has poor controllability, the energy band gap in the region serving as the waveguide in the proximity of the laser resonator facet can be made larger than that in the active region, and a semiconductor laser having a window structure and prescribed characteristics can be obtained with good repeatability, and since the window can be formed during the formation of the active layer, a process of forming a window structure after the cleavage does not have to be conducted and a semiconductor laser having a window structure can easily be obtained. Furthermore, since the active layer can be formed at a lower temperature, a semiconductor laser having excellent characteristics can be obtained.

According to a sixteenth aspect of the present invention, in the method of fabricating a semiconductor laser described as the fifteenth aspect of the present invention, the active layer comprises GaInP. Therefore, a semiconductor laser having a window structure can easily be provided with repeatability without reducing the yield.

According to an seventeenth aspect of the present invention, in the method of fabricating a semiconductor laser described as the fifteenth aspect of the present invention, the step of forming an active layer is conducted while the active region of the active layer is irradiated with laser light so that the active region is heated to a temperature higher than that in the region of the active layer other than the active region. Therefore, a semiconductor laser having a window structure can easily be provided with repeatability without reducing the yield.

According to a eighteenth aspect of the present invention, in the method of fabricating a semiconductor laser described as the seventeenth aspect of the present invention, a plane shape of an irradiation region of the laser light is a point shape; and the irradiation of the laser light is conducted by scanning the point shape laser light along the active region. Therefore, a semiconductor laser having a window structure can easily be provided with repeatability without reducing the yield.

According to a nineteenth aspect of the present invention, in the method of fabricating a semiconductor laser described as the eighteenth aspect of the present invention, a scanning cycle of the laser light is equal to or less than the time needed for the active layer to grow by one monolayer. Therefore, the window structure can be formed in the window structure forming region while uniformly heating the growth surface by each monolayer, and the energy band gap of the window structure can be made uniform, thereby providing a semiconductor laser having better characteristics.

According to a twentieth aspect of the present invention, in the method of fabricating a semiconductor laser described as the seventeenth aspect of the present invention, a plane shape of an irradiation region of the laser light is the same as the plane shape of the active region; and the irradiation of the laser light is conducted such that the irradiation region of the laser light is superimposed on the active region. Therefore, the scanning mechanism of the laser device which emits the laser light becomes unnecessary, and a semiconductor laser can be formed by using inexpensive laser device of a simple structure.

According to a twenty-first aspect of the present invention, in the method of fabricating a semiconductor laser described as the fifteenth aspect of the present invention, the step of forming the active layer is conducted while the active region of the active layer is irradiated with light such that the active region is heated to a temperature higher than that in the region of the active layer other than the active region. Therefore, a semiconductor laser having a window structure can easily be provided with repeatability without reducing the yield.

According to a twenty-second aspect of the present invention, the method of fabricating a semiconductor laser described as the fifteenth aspect of the present invention further comprises forming a recess by removing by etching the rear surface side of the active region of the semiconductor substrate to a prescribed depth; filling the recess with a material having thermal conductivity higher than that of the semiconductor substrate, thereby forming a high thermal conductivity layer; the steps of forming an filling the recess being conducted before the step of forming the active layer; and the growth of the active layer being conducted using a substrate heating type MOCVD apparatus which heats the semiconductor substrate by a heating body from the rear surface side. Therefore, using the prior art substrate heating type MOCVD apparatus, by improving the thermal conduction to the growth surface in the active region, the window structure can be formed in the active layer while the growth temperature in the active region is raised, and a semiconductor laser having a window structure can easily be formed.

According to a twenty-third aspect of the present invention, the method of fabricating a semiconductor laser described as the fifteenth aspect of the present invention further comprises forming a recess by removing by etching the rear surface side of the region of the semiconductor substrate other than the active region to a prescribed depth before the step of forming the active layer; and the growth of the active layer being conducted using a substrate heating type MOCVD apparatus which heats the semiconductor substrate by a heating body from the rear surface side. Therefore, using the prior art substrate heating type MOCVD apparatus, by reducing the heat conduction to the growth surface in the region other than the active region, the growth temperature of the active layer in this region can be lowered, and the active layer can be formed such that the energy band gap in the region serving as a waveguide in the proximity of the laser resonator facet becomes larger than that in the active region, and a semiconductor laser having a window structure can easily be formed.

According to a twenty-fourth aspect of the present invention, the method of fabricating a semiconductor laser described as the fifteenth aspect of the present invention further comprises the step of filling the recess with a material having thermal conductivity lower than that of the semiconductor substrate after the step of forming the recess, thereby forming a low thermal conductivity layer. Therefore, using the prior art substrate heating type MOCVD apparatus, by reducing the heat conduction to the growth surface in the region other than the active region, the growth temperature of the active layer in this region can be lowered, and the active layer can be formed such that the energy band gap in the region serving as a waveguide in the proximity of the laser resonator facet becomes larger than that in the active region, and a semiconductor laser having a window structure can easily be formed.

According to a twenty-fifth aspect of the present invention, the method of fabricating a semiconductor laser described as the fifteenth aspect of the present invention further comprises forming a recess by removing by etching the rear surface side of the active region of the semiconductor substrate to a prescribed depth; forming a low reflectivity film having reflectivity lower than that of the semiconductor substrate on the bottom surface of the recess; the steps of forming the recess and the low reflectivity film being conducted before the step of forming the active layer; and the growth of the active layer being conducted using a substrate heating type MOCVD apparatus which heats the semiconductor substrate by a light source from the rear surface side. Therefore, using the prior art substrate heating type MOCVD apparatus, by reducing the absorption of heat in the region other than the active region, the growth temperature of the active layer in this region can be lowered, and the active layer can be formed such that the energy band gap in the region serving as a waveguide in the proximity of the laser resonator facet becomes larger than that in the active region, and a semiconductor laser having a window structure can easily be formed.

According to a twenty-sixth aspect of the present invention, the method of fabricating a semiconductor laser described as the fifteenth aspect of the present invention further comprises forming a recess by removing by etching the rear surface side of the region of the semiconductor substrate other than the active region to a prescribed depth; forming a high reflectivity film having reflectivity higher than that of the semiconductor substrate on the bottom surface of the recess; the steps of forming the recess and the high reflectivity film being conducted before the step of forming the active layer; and the growth of the active layer being conducted using a substrate heating type MOCVD apparatus which heats the semiconductor substrate by a light source from the rear surface side. Therefore, using the prior art substrate heating type MOCVD apparatus, by reducing the absorption of heat in the region other than the active region, the growth temperature of the active layer in this region can be lowered, and the active layer can be formed such that the energy band gap in the region serving as a waveguide in the proximity of the laser resonator facet becomes larger than that in the active region, and a semiconductor laser having a window structure can easily be formed.

According to a twenty-seventh aspect of the present invention, in the method of fabricating a semiconductor laser described as the sixteenth aspect of the present invention, the semiconductor substrate constitutes a part of a wafer having a front surface; the method of fabricating a semiconductor laser further comprises the step of forming a marker for alignment in a region on the front surface of the wafer not including the semiconductor substrate; and the alignment in subsequent steps after the step of forming the active layer is conducted using the marker. Therefore, the precision in positioning the region where the window structure is formed can be improved and the yield of the semiconductor laser can be improved.

DETAILED DESCRIPTION OF THE PREFERRED EMBODIMENTS

Embodiment 1

Figure 1:
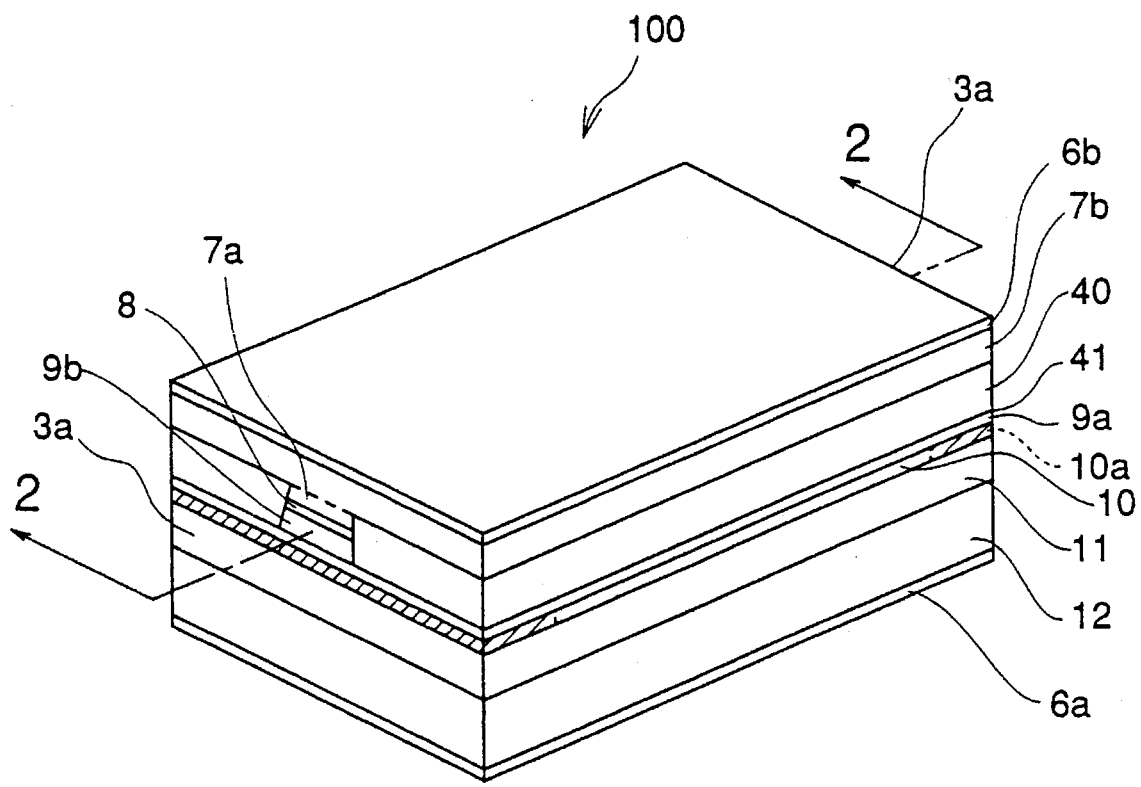
FIG. 1 is a perspective view illustrating the structure of a semiconductor laser according to a first embodiment of the present invention.

FIG. 1 is a perspective view illustrating a structure of a semiconductor laser according to a first embodiment of the present invention. In the figure, reference numeral 100 designates a semiconductor laser, reference numeral 12 designates an n type GaAs substrate, reference numeral 11 designates an n type AlGaInP cladding layer, reference numeral 10 designates a GaInP active layer, and reference numeral 10a designates a window structure in the GaInP active layer. Reference numerals 9a and 9b designate a p type AlGaInP cladding layer, reference numeral 41 designates a p type GaInP etching stopper layer whose thickness is as extremely small as 50 A, reference numeral 8 designates a p type GaInP band discontinuity layer, reference numeral 7a designates a p type GaAs cap layer, reference numeral 7b designates a p type GaAs contact layer, reference numeral 6a designates an n side electrode, reference numeral 6b designates a p type electrode, reference numeral 40 designates an n type GaAs current blocking layer, and reference numeral 3a designates a laser resonator facet.

FIG. 2(a) is a cross-sectional view of the semiconductor laser illustrated in FIG. 1 taken along a line 2a—2a, and FIG. 2(b) is a diagram illustrating a relationship between a point on the active layer along the resonator length direction of the semiconductor laser and energy band gap. In the figures, the same reference numerals used in FIG. 1 designate the same or corresponding parts. In FIG. 2(b), the abscissa represents a position in the active layer 10 along the laser resonator length direction and the ordinate represents an energy band gap of the active layer 10.

Figure 5:
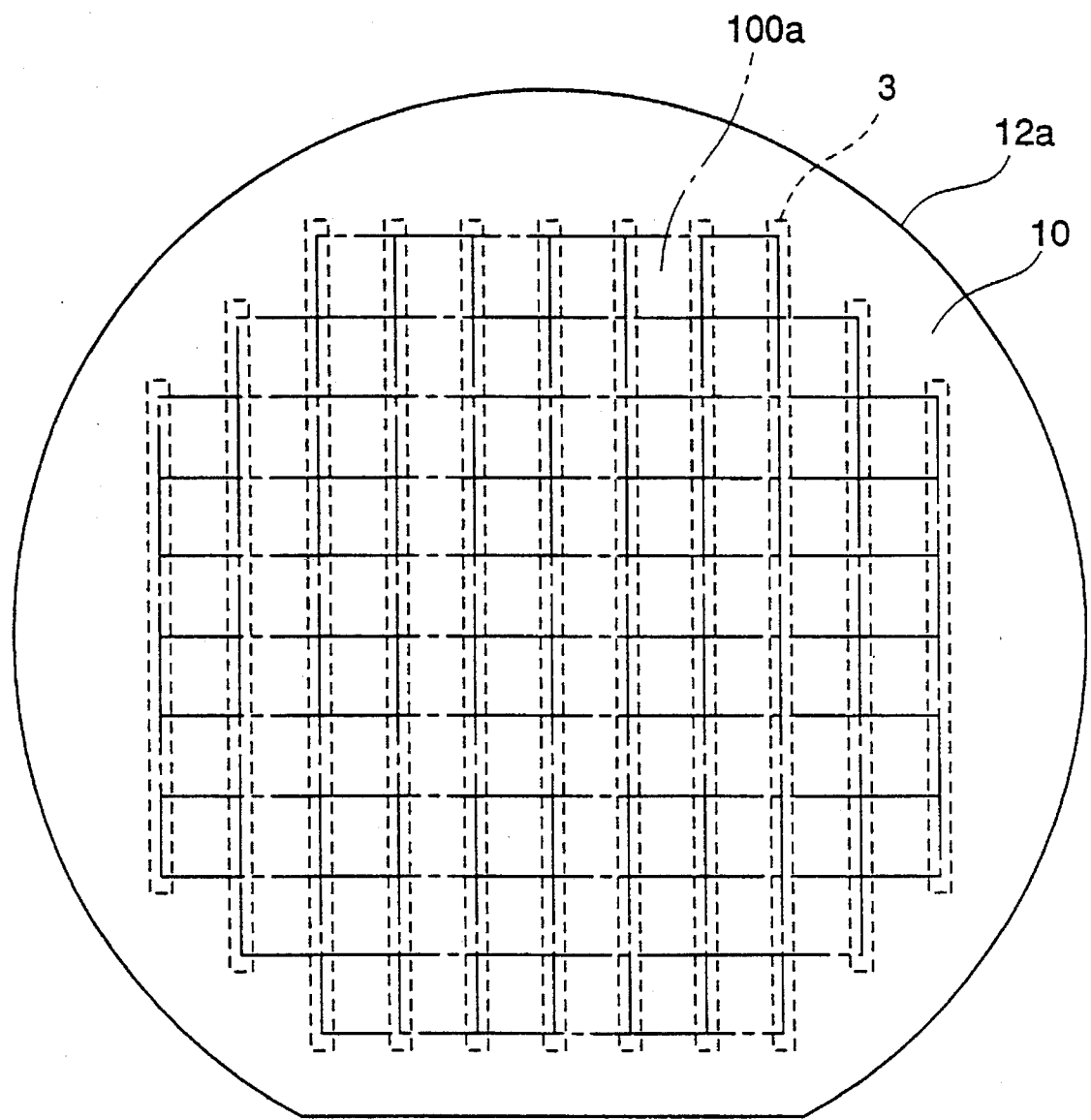
FIG. 5 is a pictorial representation of the wafer used in a fabrication of the semiconductor laser according to the first embodiment of the present invention.

FIG. 5 is a plan view pictorially illustrating a wafer before cleaving, according to the first embodiment of the present invention. In the figure, reference numeral 12a designates a wafer, reference numeral 100a designates a semiconductor laser forming region on the wafer where the semiconductor laser 100 is formed, reference numeral 3 designates a laser resonator facet proximity region of the semiconductor laser forming region 100a, and reference numeral 5 designates a region of the semiconductor laser forming region 100a other than the laser resonator facet proximity region. The semiconductor laser facet proximity region 3 is formed in a stripe shape extending in the direction perpendicular to the laser resonator length direction of the semiconductor laser 100 and parallel to each other on the wafer 12a. Its width is, for example, about 40 μm and a gap between the neighboring laser resonator facet proximity regions sandwiching the region 5 other than the laser resonator facet proximity region is about 650 μm. FIGS. 3(a)–3(f) are perspective views illustrating a method of fabricating the semiconductor laser according to the first embodiment of the present invention, magnifying one of the semiconductor laser forming regions on the wafer 12a illustrated in FIG. 5. In the figure, the same reference numerals used in FIG. 1 and FIG. 5 designate the same or corresponding parts. Reference numeral 42 designates an insulating mask of a stripe shape comprising materials such as SiN or SiON and extending in the resonator length direction of the semiconductor laser 100.

Figure 6:
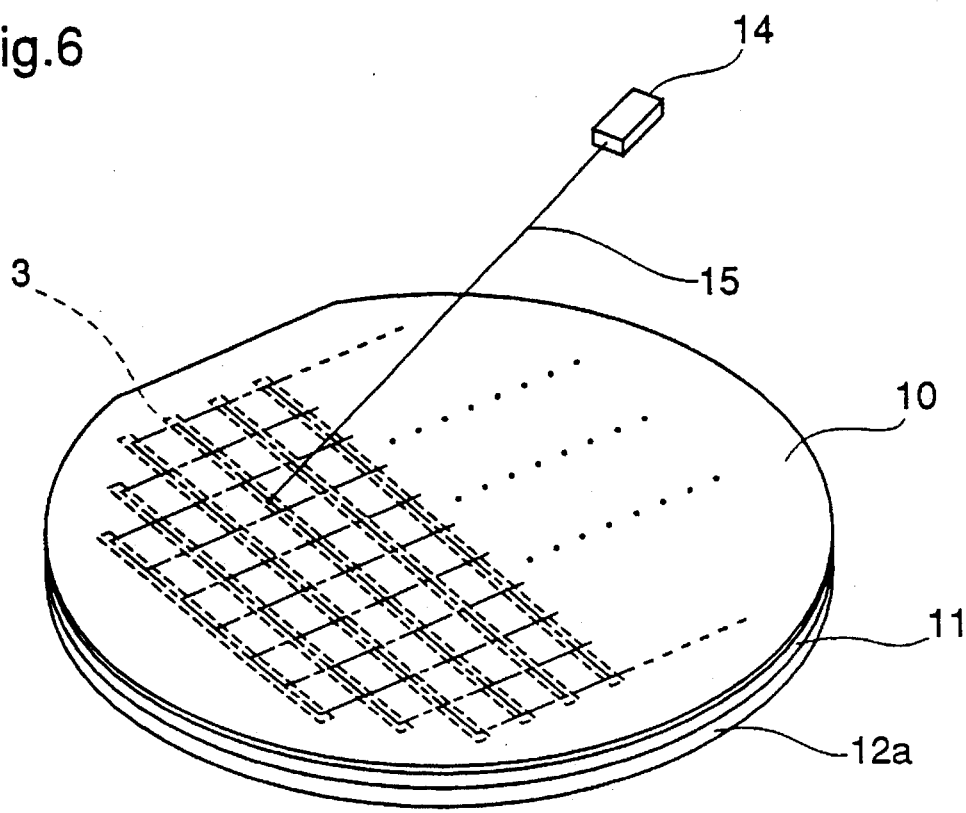
FIG. 6 is a perspective view illustrating the main process of the method of fabricating the semiconductor laser according to the first embodiment of the present invention.

FIG. 6 is a perspective view illustrating the main process of the method of fabricating the semiconductor laser according to the first embodiment of the present invention. In the figure, the same reference numerals used in FIGS. 3(a)–3(f) are to designate the same or corresponding parts and reference numeral 14 designates a laser device which emits a laser light 15 whose irradiation region is a point shape and has a scanning mechanism (not shown in the figure) such that the laser light 15 scans the surface of the wafer 12a in a prescribed direction.

Figure 4:
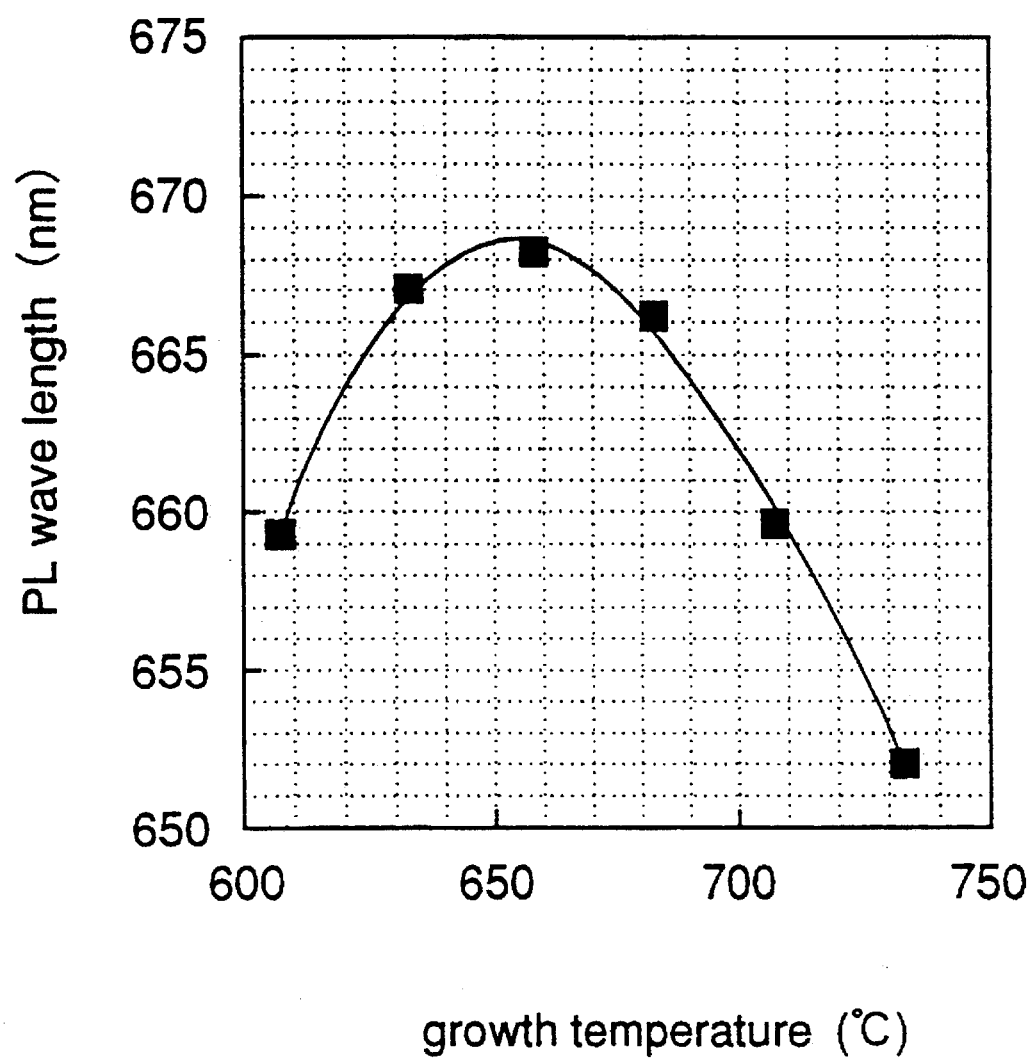
FIG. 4 is a graph showing a relationship between a growth temperature of the GaInP layer and the PL wavelength according to the first embodiment of the present invention.

FIG. 4 is a graph illustrating a relationship between a growth temperature of the GaInP layer and a PL (photoluminescence) wavelength of this GaInP layer which is used with reference to the description of the method of fabricating the semiconductor laser according to the first embodiment of the present invention. In the figure, the abscissa represents the growth temperature (° C.) of the GaInP layer and the ordinate represents the PL wavelength (nm) of the GaInP layer. This relationship between the growth temperature and the PL wavelength has been obtained from the experiment in which a GaInP layer (not shown in the figure) is formed on a GaAs substrate (not shown in the figure) with varying growth temperatures and the PL wavelength of this GaInP layer is measured.

Next, the fabricating method will be described with reference to FIGS. 3(a)–3(f) and FIG. 6. First, the n type AlGaInP cladding layer 11 is grown on the wafer 12a, that is, on the n type GaAs substrate 12 in a wafer state, by vapor deposition methods such as MOCVD or MBE (Molecular Beam Epitaxy).

Next, the GaInP active layer 10 is grown on the n type AlGaInP cladding layer 11 by MOCVD or MBE. When this GaInP active layer 10 is grown, the GaInP active layer 10 is grown at a temperature higher than the growth temperature at which the PL wavelength of the GaInP layer becomes maximum, for example 655° C. or above, and the point shape laser light 15 is scanned along the laser resonator facet proximity region 3 of the active layer 10 of the wafer 12a as shown in FIG. 6.

Here, from the relationship between growth temperature of the GaInP layer which lattice-matches with the GaAs substrate and PL wavelength, it can be seen that above the growth temperature at which a PL wavelength is maximized, for example 655° C. or above, the higher a growth temperature is, the shorter a PL wavelength becomes. Since shorter wavelength means greater energy band gap, this illustrates that energy band gap becomes large in a region where growth temperature is high. Therefore, because of this nature, as described above, when the GaInP active layer 10 is grown, if the active layer 10 is grown at a temperature higher than the growth temperature at which the PL wavelength of the GaInP layer is maximized, for example 655° C. or above, and the point shape laser light 15 is scanned along the laser resonator facet proximity region 3 of the GaInP active layer 10 of the wafer 12a, then, in the region irradiated with the laser light 15, GaInP is epitaxially grown while being heated more than GaInP on other regions and the energy band gap of the GaInP layer on the region thus heated becomes larger than that of the GaInP layer on the other region. For example, the growth temperature for AlGaInP/GaInP series semiconductor lasers is usually around 700° C., and if the temperature difference between the region scanned with the laser light and the other region is about 20° C., then the energy band gap difference becomes about 17 meV. Therefore, the energy band gap of the region of the active layer 10 which is heated by irradiating the laser light becomes larger than the energy band gap of the other region, and a window structure is formed in the region irradiated by the laser light (FIG. 3(a)).

Figure 3:
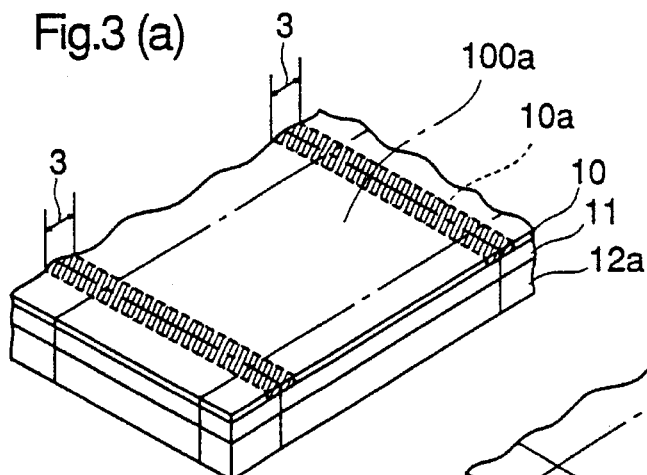
FIGS. 3(a)-3(f) are perspective views illustrating how a semiconductor laser is fabricated according to the first embodiment of the present invention.
Figure 3:
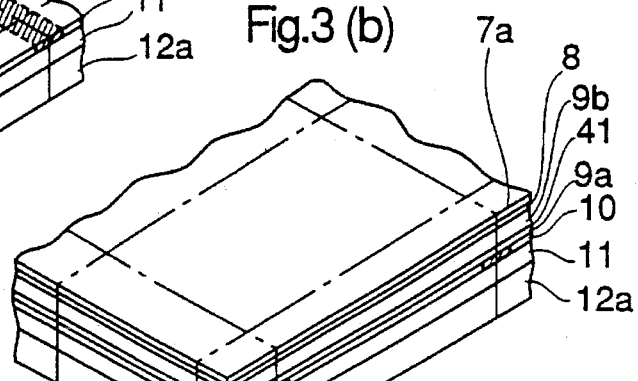
Figure 3:
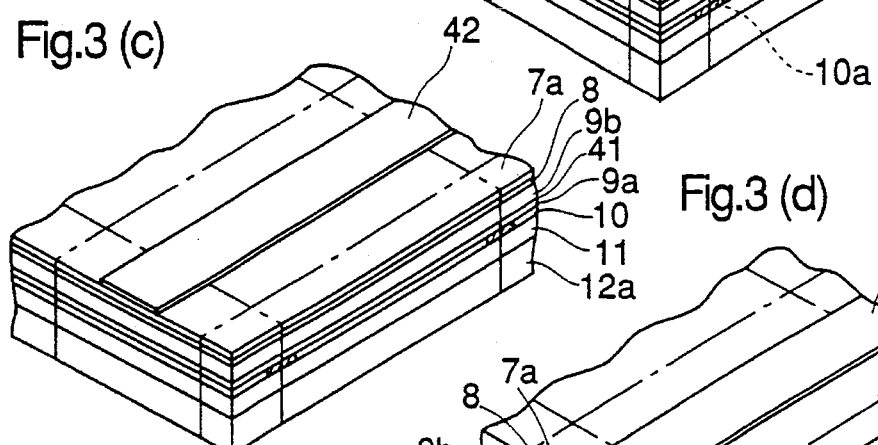
Figure 3:
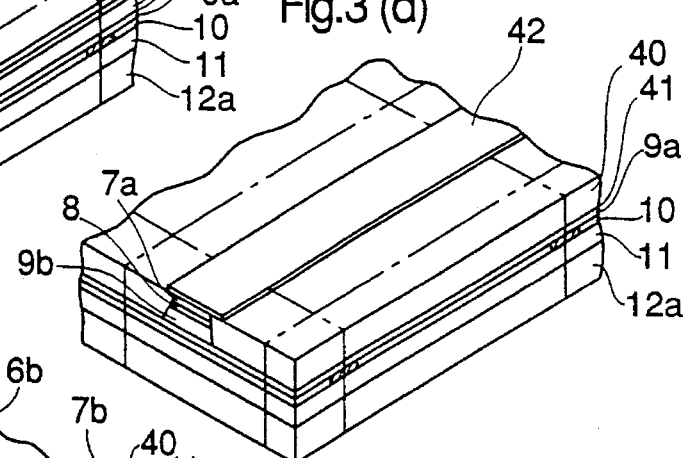
Figure 3:
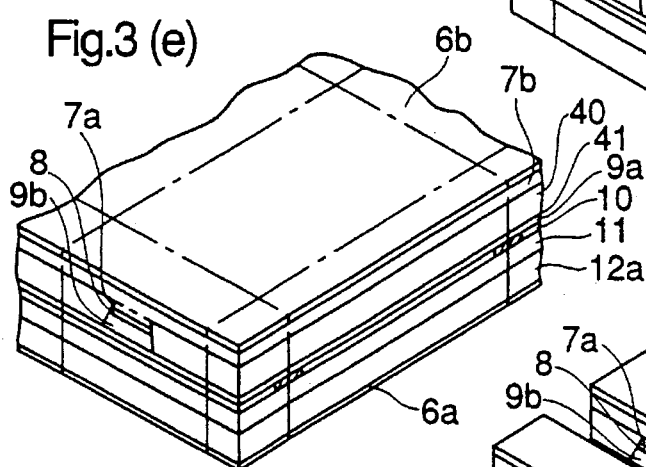
Figure 3:
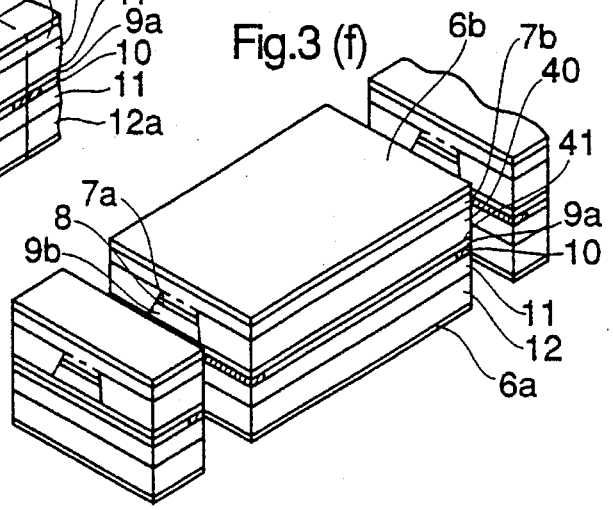

Next, as shown in FIG. 3(b), the p type AlGaInP cladding layer 9a, the p type GaInP etching stopper layer 41, the p type AlGaInP cladding layer 9b, the p type GaInP band discontinuity layer 8, and the p type GaAs cap layer a 7a are epitaxially grown in this order on the GaInP active layer 10 by MOCVD or MBE. Then, the insulating film such as an SiN film or an SiON film is formed by CVD or sputtering, and, by combining the process of applying a resist and a photolithographic process, the insulating film mask 42 having a stripe shape extending in the laser resonator length direction is formed (FIG. 3(c)). Next, utilizing this insulating film mask 42 as a mask, the p type GaAs cap layer 7a is selectively etched with tartaric acid based etchant. Then, the p type GaInP band discontinuity layer 8 is etched with a hydrochloric acid based etchant and the p type AlGaInP cladding layer 9b is etched with a sulfuric acid based etchant, thereby forming the ridge stripe. Here, the etching of the p type AlGaInP cladding layer 9b can be precisely halted by the etching stopper layer 41. Then, using the insulating film mask 42 as a mask for selective growth, the n type GaAs current blocking layer 40 is grown so as to bury the ridge stripe (FIG. 3(d)). The insulating film mask 41 is then removed and the p type GaAs contact 7b is epitaxially grown on both the current blocking layer 40 and the p type GaAs cap layer 7a. Next, the p side electrode 6b and the n side electrode 6a are formed on the contact layer 7b and on the rear surface side of the wafer 12a, respectively (FIG. 3(e)). The wafer 12a is, then, cleaved perpendicular to the laser resonator length direction at the center of the laser resonator facet proximity region along its laser resonator length direction, forming the laser resonator facet 3a (FIG. 3(f)), and is further cleaved parallel to the laser resonator length direction to separate each element, thereby obtaining the semiconductor laser 100.

Figure 27:
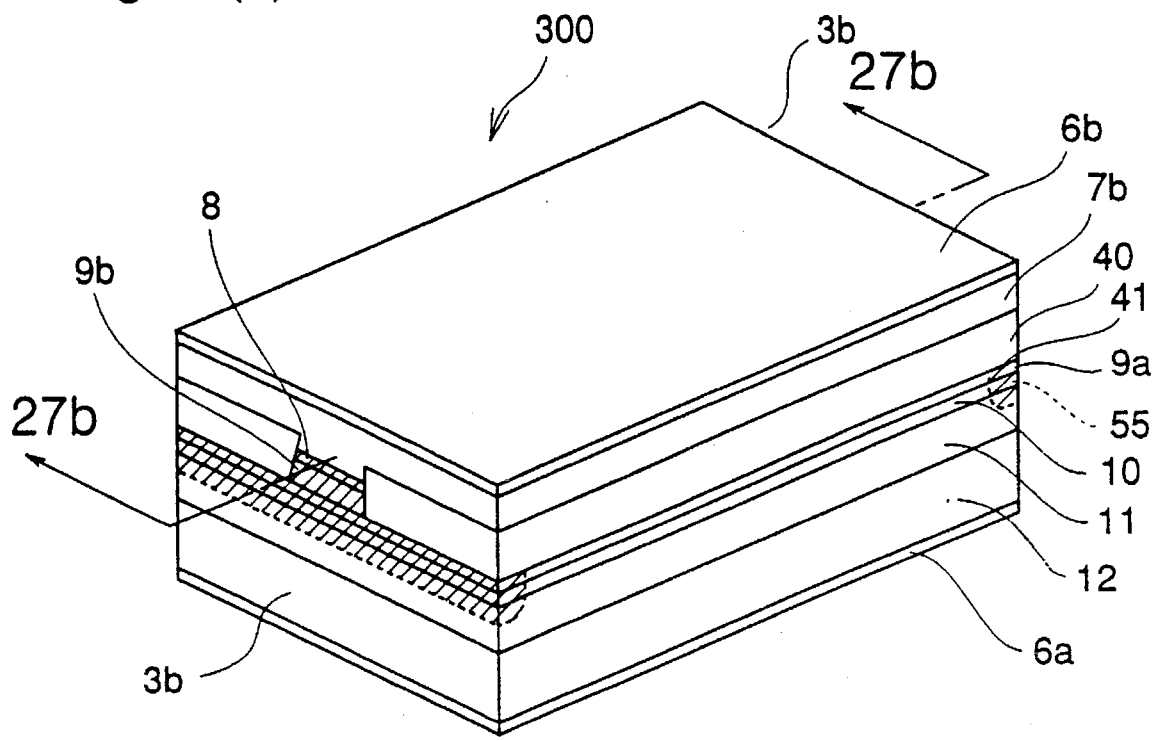
FIGS. 27(a) and 27(b) are a perspective view and a cross-sectional view, respectively, illustrating the structure of a prior art semiconductor laser.
Figure 27:
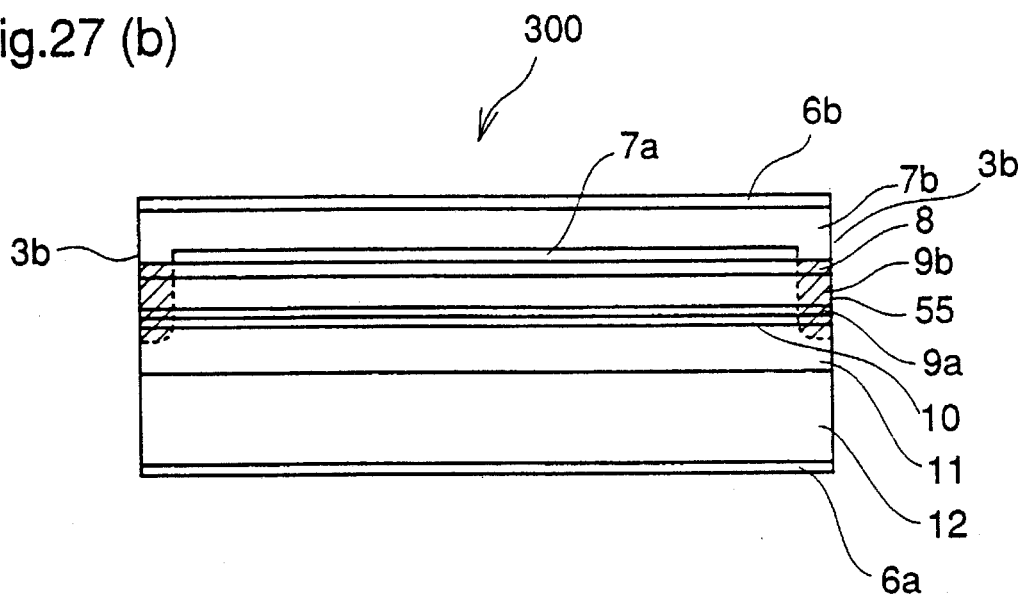
Figure 28:
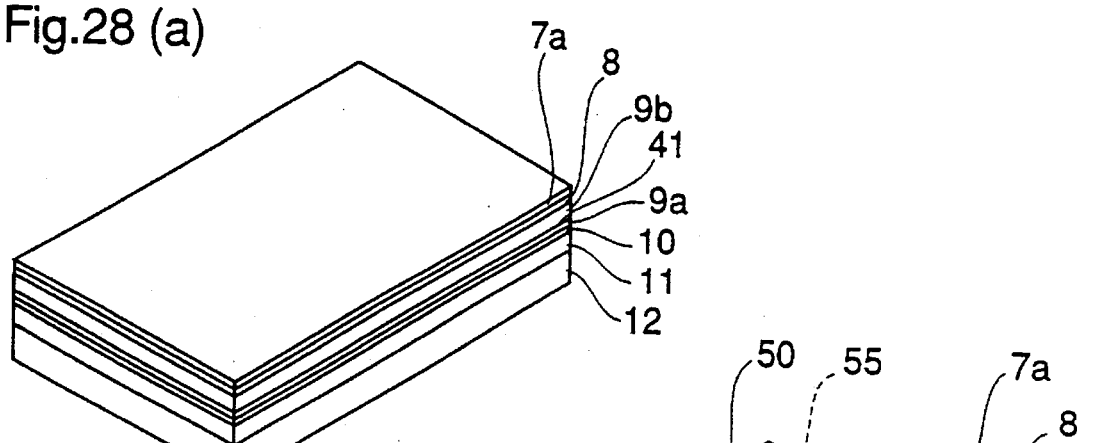
FIGS. 28(a)-28(d) are perspective views illustrating a method of fabricating a prior art semiconductor laser.
Figure 28:
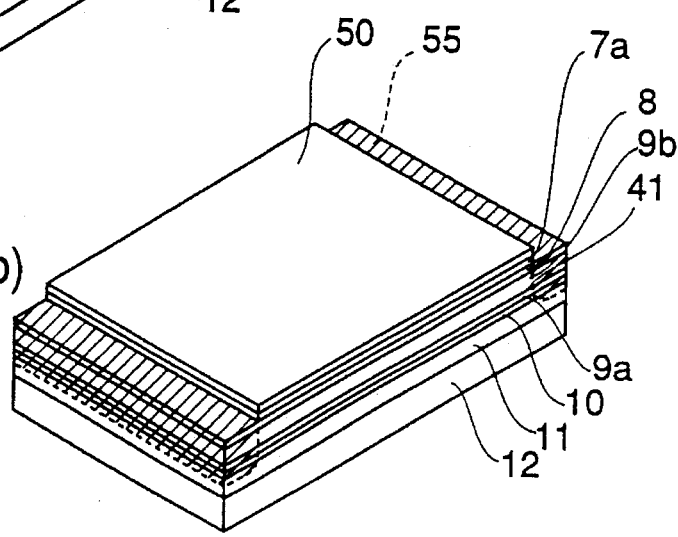
Figure 28:
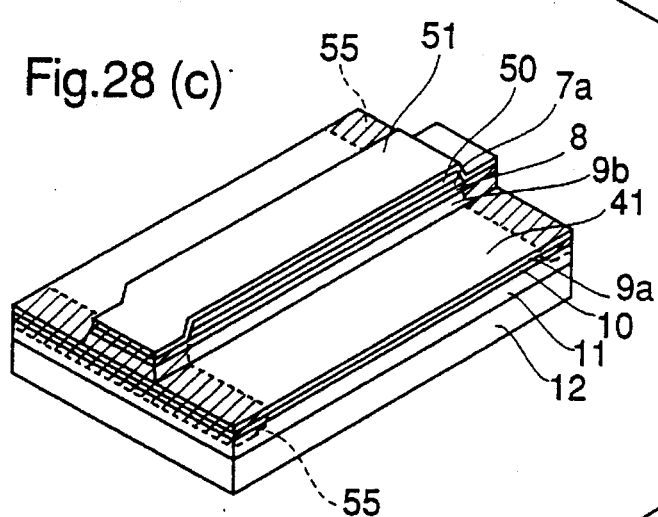
Figure 28:
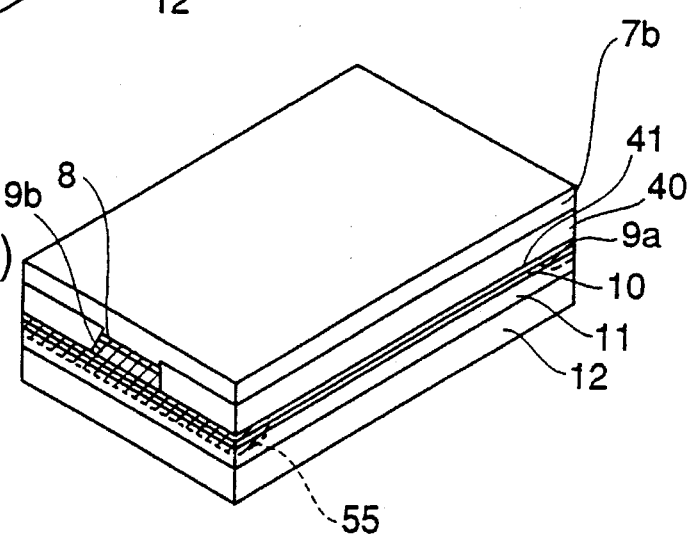
Figure 29:
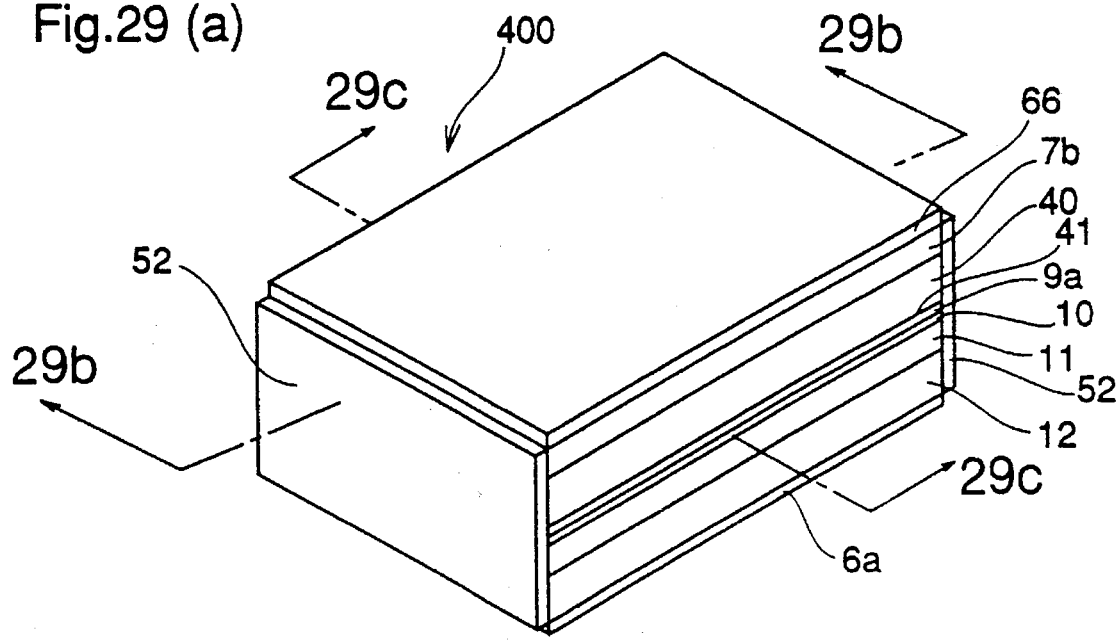
FIG. 29(a) is a perspective view illustrating the structure of another prior art semiconductor laser.
FIG. 29(b) is a cross-sectional view of the semiconductor laser in the laser resonator length direction.
FIG. 29(c) is a cross-sectional view of the semiconductor laser in the laser resonator width direction.
Figure 29:
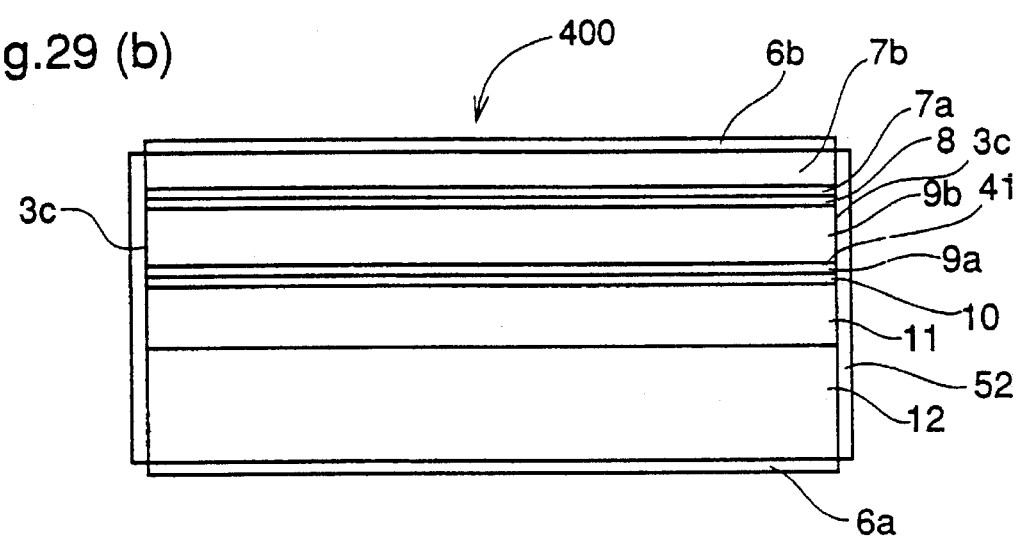
Figure 29:
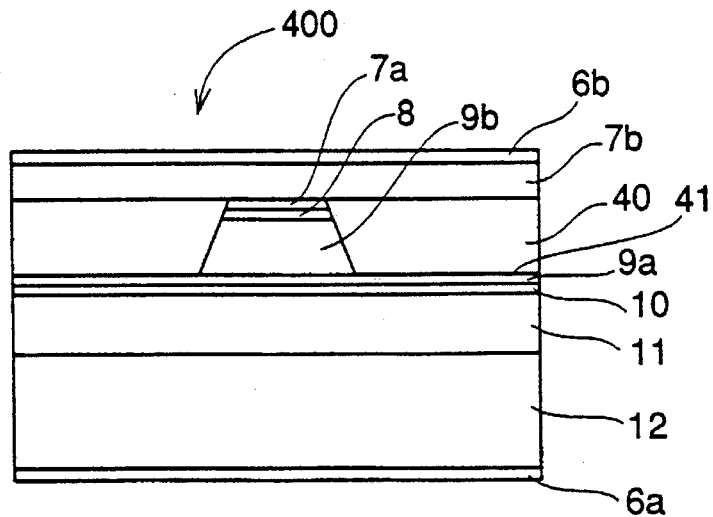

In the semiconductor laser 100 according to the first embodiment of the present invention, when forming the active layer 10, by irradiating the laser resonator facet proximity region 3 with the laser light 15, the active layer 10 is grown while the temperature at the laser resonator facet proximity region is raised, thereby widening the energy band gap in this region of the active layer and forming the window structure 10a. Thus, light emitted in the region of the active layer 10 under the ridge stripe, that is, the light emitting region of the active layer contributing to the emission of light, is not absorbed at the laser resonator facet 3a. The semiconductor laser according to the first embodiment of this invention differs from the prior art semiconductor laser 300 illustrated in FIGS. 27(a) and 27(b), whose window structure is formed by widening the energy band gap in the proximity of the laser resonator facet with diffusing the impurity such as Zn which lowers an electrical resistance, in that the energy band gap is widened by heating with the laser light 15 when the active layer 10 is grown. In this heating process, if the laser resonator facet proximity region of the active layer 10 is heated such that the energy band gap becomes sufficiently larger than that of the light emitting region of the active layer 10, even if the heating is more or less non-uniform, results in only a slightly non-uniform energy band gap, and the window structure sufficiently functions, producing no significant negative effect on the characteristics of the semiconductor laser 100. That is, there is no leakage current which results from the lowered electrical resistance at the laser resonator facet region due to non-uniform diffusion of an impurity, and a semiconductor laser having desired characteristics can be repeatedly obtained.

Furthermore, in another type of the prior art semiconductor laser 400, in order to form a window structure, it was necessary to epitaxially grow the window structure 52 on the laser resonator facet after the cleavage, and because of the difficult handling, the yield was reduced and the fabricating process became complicated. However, in the semiconductor laser according to the first embodiment of the present invention, since the window structure is formed before the cleavage, during the formation of the active layer 10 on the wafer 12a, there is no need to handle an individual chip which is cleaved and thus quite delicate when the window structure is formed. Furthermore, since the window structure 10a is formed simultaneously with the active layer 10, there is no additional process of forming the window structure layer 52, and the method of fabricating the semiconductor laser is simplified.

As described so far, according to the first embodiment of the present invention, since, in the process of epitaxially growing the active layer 10, the GaInP active layer 10 is grown at a temperature above the growth temperature at which the PL wavelength of the GaInP active layer is maximized, and the region in the proximity of the laser resonator facet is further heated by irradiation with laser light, the semiconductor laser having desired characteristics is easily formed with great repeatability.

Figure 9:
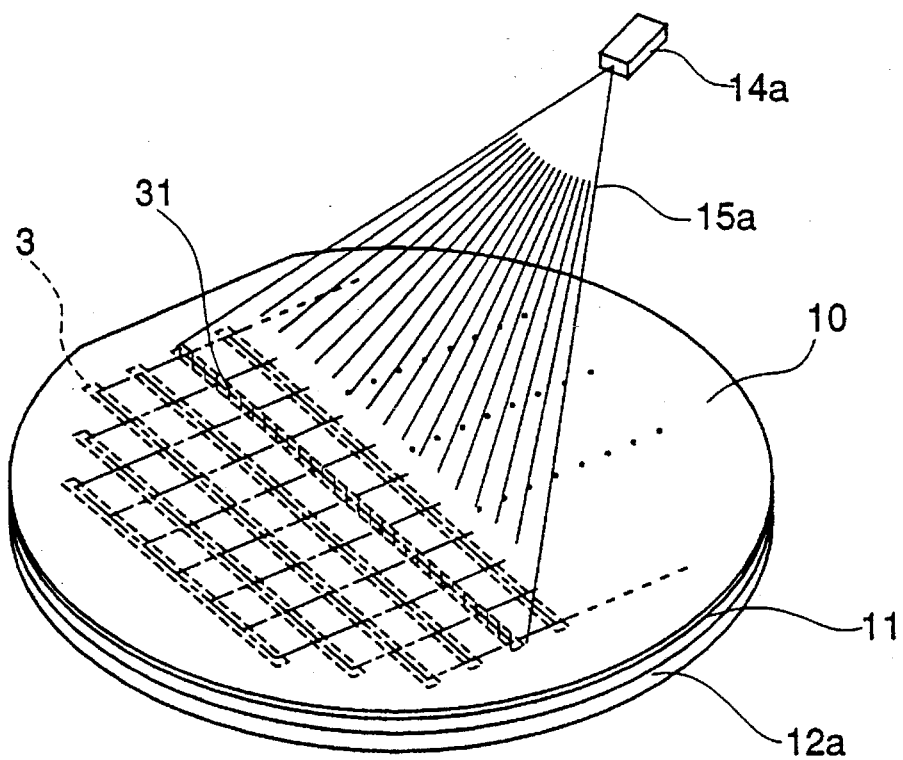
FIG. 9 is a perspective view illustrating the main process of the method of fabricating a semiconductor laser according to a modification of the first embodiment of the present invention.

While, in the first embodiment of the present invention, the laser device 14 which emits the laser light 15 in a point shape is used when heating the laser resonator facet proximity region 3 of the active layer 10, this invention can also be applied to cases with a laser device which emits laser light having different shapes is used. For example, as illustrated in FIG. 9, the laser device 14a emits the laser light 15a spreading in a band shape into the laser light irradiation region 31 along the laser resonator facet proximity region 3 on the wafer 12a can be used, and the laser light 15a can be emitted in such a way that the laser light irradiation region 31 is superimposed on the laser resonator facet proximity region 3. Even in this case, a similar effect as in the first embodiment can be obtained, and since the laser device 14a does not require a scanning mechanism such as the one for the laser device 14, semiconductor lasers can be formed by using an inexpensive laser device of a simpler structure. In FIG. 9, the same reference numerals used in FIG. 6 are to designate the same or corresponding parts.

Furthermore, in the first embodiment of the present invention, by making the scanning cycle for the point shape laser light 15 sweep the laser resonator facet proximity region 3 when epitaxially growing the active layer 10 for a time equal to or less than the time required for the active layer 10 to grow by one monolayer, the active layer 10 at the laser resonator facet proximity region 3 can be formed while the growth surface is uniformly heated for each monolayer, and the energy band gap of the window structure 10a of the active layer 10 formed while irradiating with the laser light 15 can be made uniform and a semiconductor laser of excellent characteristics is obtained.

Figure 10:
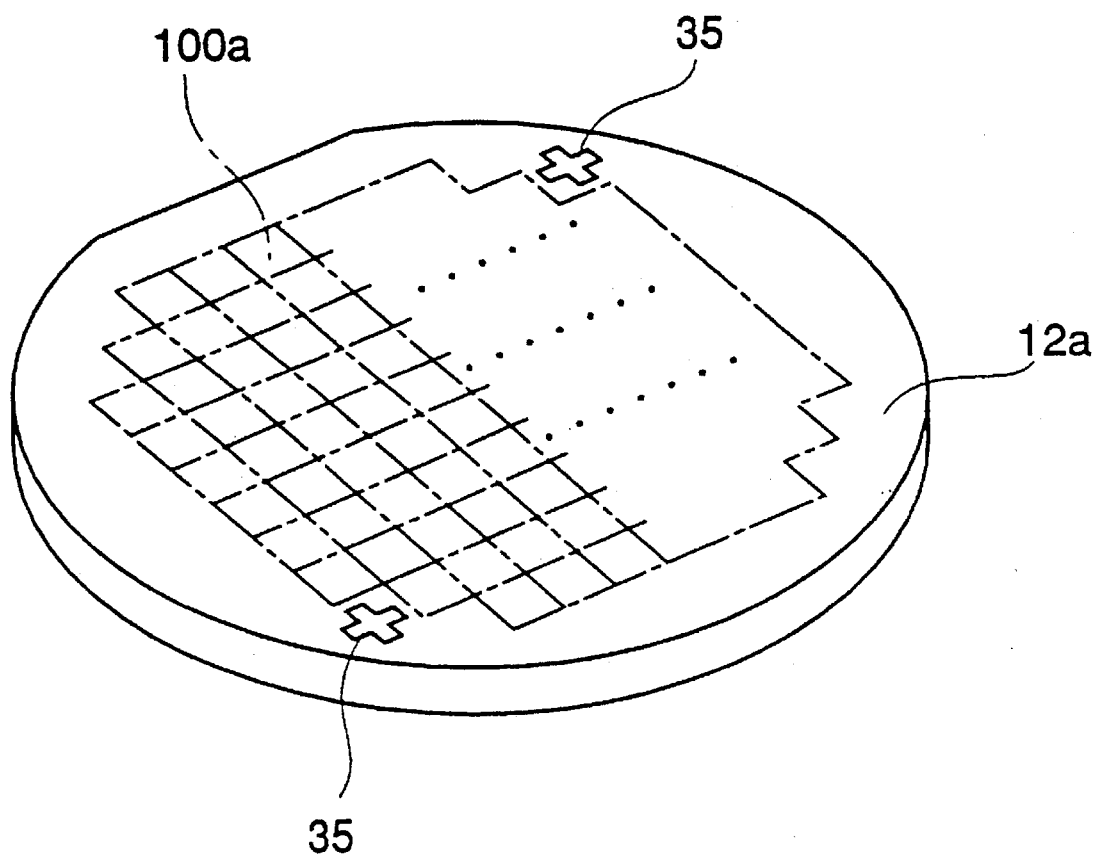
FIG. 10 is a perspective view illustrating the main process of the method of fabricating a semiconductor laser according to another modification of the first embodiment of the present invention.

Furthermore, in a method of fabricating a prior art semiconductor laser, a marker is often placed on a wafer to align a ridge stripe to the cleavage position before or after the formation of the ridge stripe. In the first embodiment of the present invention, since it is necessary to align the laser resonator facet proximity region of the active layer which is heated by the laser light 15 to the position of the ridge stripe or the like, the marker 35 for position alignment indicating the position of the semiconductor laser element forming region 100a can be formed on the wafer 12a before the formation of the active layer by etching or the like as illustrated in FIG. 10. By using the marker 35 such as this, the precision with which the window structure 10a which is formed by heating with the laser light 15 is aligned to the ridge stripe or the like can be improved, and the yield of semiconductor lasers can be improved.

Furthermore, while, in the first embodiment of the present invention, the laser resonator facet proximity region 3 is heated with the laser light 15, in the present invention, the light emitted from an IR (Infrared Rays) lamp or a halogen lamp or the like which is focused into a point shape by a lens can be used as a means of heating, instead of the laser light 15 of the first embodiment, irradiating and heating the laser resonator facet proximity region 3. Even in this case, a similar effect as in the first embodiment can be obtained.

Figure 11:
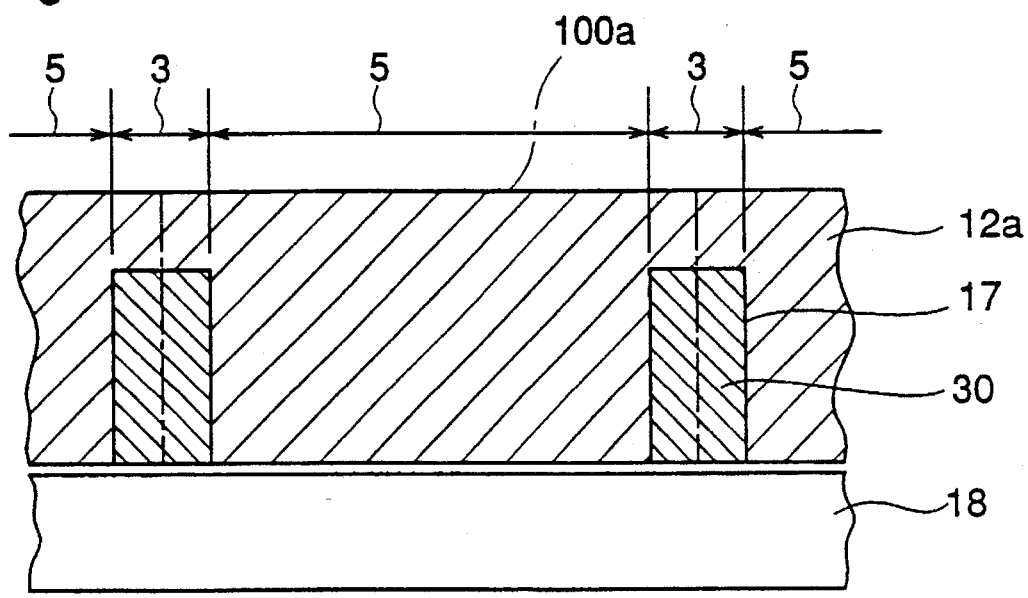
FIG. 11 is a cross-sectional view illustrating the main process of the method of fabricating a semiconductor laser according to another modification of the first embodiment of the present invention.

In the first embodiment of the present invention, although the laser resonator facet proximity region 3 is heated by irradiation with the laser light 15, when a substrate heater which heats the substrate (wafer) from the rear surface side with a heating body is used for growing the semiconductor laser 100, as in FIG. 11 illustrating the cross-section of the wafer 12a which is used to form the semiconductor laser 100 in the laser resonator length direction, the rear surface side of the laser resonator facet proximity region 3 of the semiconductor laser formation region 100a of the wafer 12a can be etched beforehand to a desired depth to form a recess 17. Then a high thermal conductivity layer 30 comprising materials having higher thermal conductivity than the wafer 12a, such as AlN (aluminum nitride), or BN (boron nitride) is formed on the rear surface of the wafer by evaporation or the like. Using a method of removing the high thermal conductivity layer 30 formed in a region except the inside of the recess 17 by etching or the like, the recess can be filled with the high thermal conductivity layer 30, thereby improving thermal conduction from the heating body to the growth surface in the laser resonator facet proximity region 3 on the wafer 12a the improved thermal conduction makes deceasing the temperature on the growth surface difficult, so that the temperature on the growth surface in the laser resonator facet proximity region 3 becomes higher than that of the growth surface in the region of the semiconductor laser element forming region 100a other than the laser facet proximity region. Thus the growth temperature of the active layer formed in the laser resonator facet proximity region 3 is higher than the temperature of the active layer 10 in the region 5 outside the laser facet proximity region. In this case, the growth temperature in the laser resonator facet proximity region 3 can be made higher than that of the other region 5 and a similar effect as in the first embodiment can be obtained. In addition, since, as a fabrication apparatus of a semiconductor laser, a growth apparatus having a laser device such as the one in the first embodiment does not have to be used, and since a semiconductor laser having a window structure can be obtained using a prior art MOCVD apparatus, a semiconductor laser having a window structure can be obtained more easily than by using the method of fabricating a semiconductor laser in the first embodiment.

Figure 12:
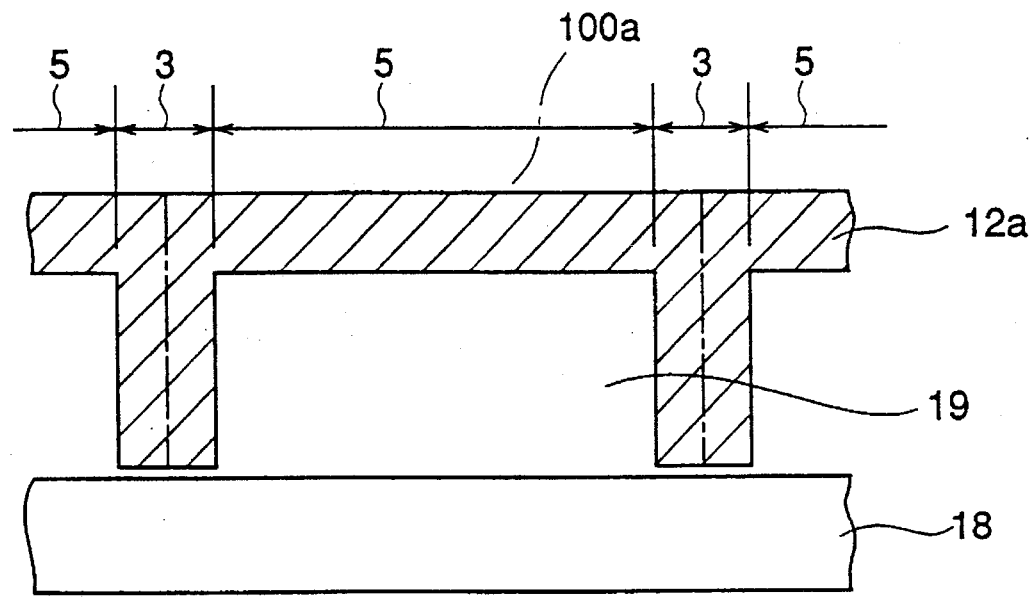
FIG. 12 is a cross-sectional view illustrating the main process of the method of fabricating a semiconductor laser according to another modification of the first embodiment of the present invention.

Furthermore, as in FIG. 11, by etching the rear surface side of the region 5, other than the laser resonator facet proximity region, and by forming a recess 19 as shown in FIG. 12, the thermal conductivity between the region 5 other than the laser resonator facet proximity region and the heating body 18 can be decreased and the growth temperature of the active layer forming at the laser resonator facet proximity region 3 can be made higher than that of the active layer at the other region 5. Even in this case, a similar effect as in the first embodiment can be obtained. In FIG. 12, the same reference numerals used in FIG. 11 are to designate the same or corresponding parts.

Figure 13:
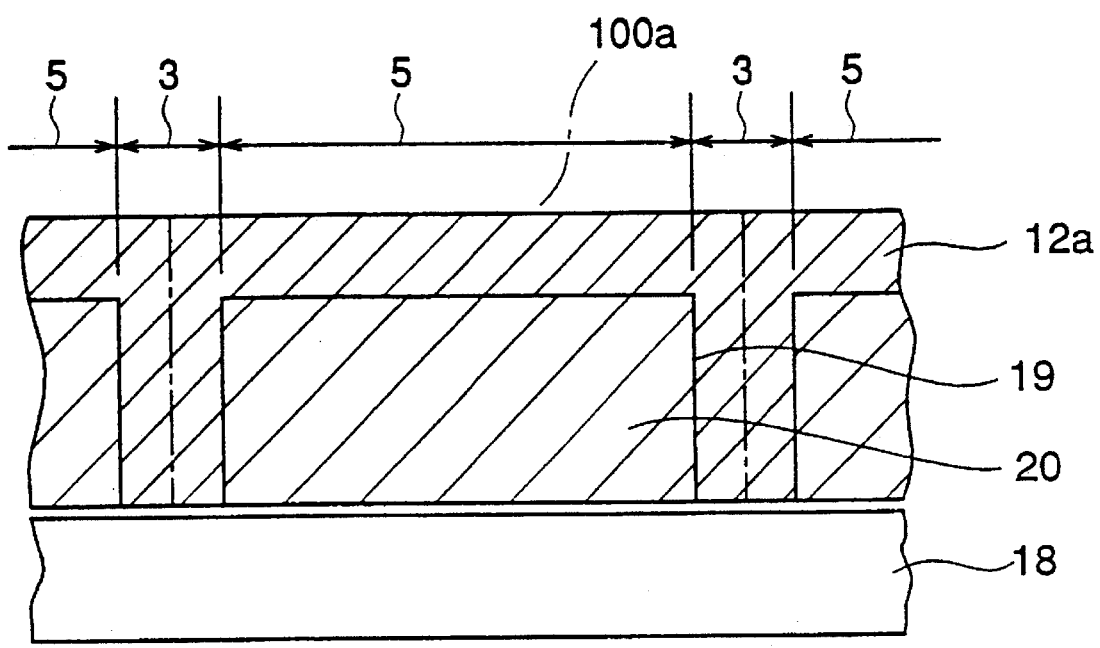
FIG. 13 is a cross-sectional view illustrating the main process of the method of fabricating a semiconductor laser according to another modification of the first embodiment of the present invention.

Furthermore, as shown in FIG. 13, the recess 19 in the wafer 12a illustrated in FIG. 12 can be filled with materials having thermal conductivity lower than that of the wafer 12a, such as $SiO_2$, InGaAs, and the like, similar to the high thermal conductivity layer 30 illustrated in FIG. 11, thereby forming a low thermal conductivity layer 20. By forming the semiconductor laser 100 using this wafer 12a, the temperature on the growth surface in the laser resonator facet proximity region 3 can be made higher than the temperature on the growth surface in the other region 5. Even in a case such as this, a similar effect as in the first embodiment can be obtained.

Figure 14:
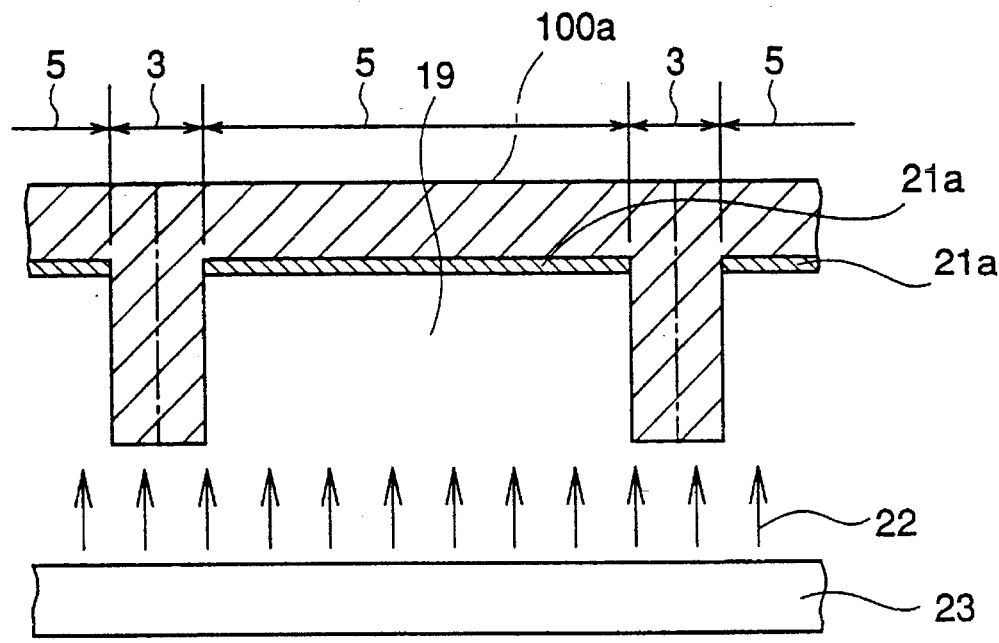
FIG. 14 is a cross-sectional view illustrating the main process of the method of fabricating a semiconductor laser according to another modification of the first embodiment of the present invention.

Furthermore, in the first embodiment of the present invention, when a substrate heater which heats the wafer from the rear surface side using light emitted from light sources such as an IR lamp or a halogen lamp is utilized as an apparatus used for fabricating the semiconductor laser 100, as illustrated in FIG. 14, a recess 19 can be formed by removing by etching the rear surface of the region 5 other than the laser resonator facet proximity region in the semiconductor laser element forming region 100a of a wafer to a prescribed depth. A single layer or multiple layers of a thin film comprising SiO, SION, $Al_2O_3$, and the like whose permeability varies with thickness is formed on the bottom surface of the recess 19 in such a thickness that its reflectivity to light from the IR lamp, the halogen light, and the like becomes higher than that of the substrate. By forming a high reflectivity film 21a, a part of the light irradiated from the light source 23 on the rear surface side of the wafer 12a, which enters the region 5 other than the laser resonator facet proximity region, is reflected, thereby reducing the absorption of the light energy in the region 5 other than the laser resonator facet proximity region, and the growth temperature of the active layer formed in the laser resonator facet proximity region 3 is made higher than that of the active layer in the other region 5. Even in a case such as this, a similar effect as in the first embodiment can be obtained, and since the growth apparatus having a laser device such as the one in the first embodiment does not have to be used as a fabrication apparatus for a semiconductor laser, and a semiconductor laser having window structure is fabricated using a convention MOCVD apparatus, a semiconductor laser having a window structure can be fabricated more easily than in the method of fabricating a semiconductor laser in the first embodiment. The reason why the high reflectivity film 21a is disposed on the surface of the recess 19 is to prevent the distribution of the absorbed light energy at the rear surface of the wafer 12a from diffusing within the wafer 12a, whose thickness is about 600 μm, when the light reaches the surface of the wafer 12a, so that a sufficient temperature distribution is obtained on the surface of the wafer 12a. FIG. 14 is a cross-section of the main part of the wafer 12a used in fabricating the semiconductor laser 100 in the laser resonator length direction.

Figure 15:
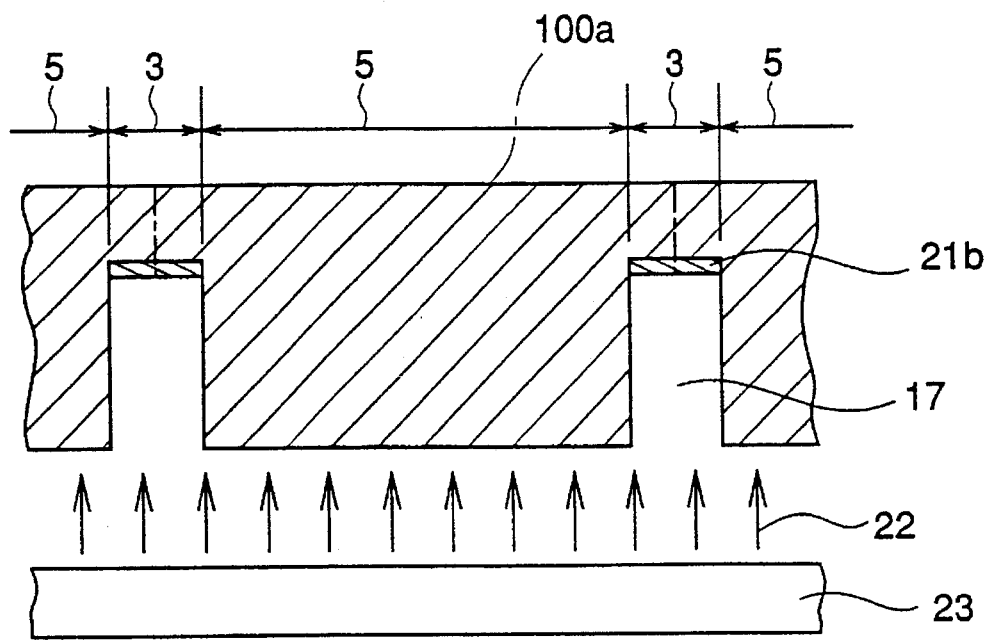
FIG. 15 is a cross-sectional view illustrating the main process of the method of fabricating a semiconductor laser according to another modification of the first embodiment of the present invention.

Furthermore, as illustrated in FIG. 15, a recess 17 can be formed by removing by etching the rear surface side of the laser resonator facet proximity region 3 of the wafer 12a to a desired depth, and a single layer or multiple layers of thin film comprising SiO, SION, SiN, $Al_2O_3$ and the like can be formed on the bottom surface of the recess 17 with such a thickness that the reflectivity for light from the IR lamp or the halogen lamp becomes lower than that of the substrate, thereby forming the low reflectivity film 21b, so that the absorption of the light energy on the rear surface of the laser resonator facet proximity region 3 of the wafer 12a is increased and the growth temperature of the active layer 10 formed on the laser resonator facet proximity region 3 of the wafer 12a is made higher than that of the active layer in the region 5 other than the laser resonator facet proximity region. Even in this case, a similar effect as in the first embodiment can be obtained. FIG. 15 is a cross-section of the main part of the wafer 12a which is used to form the semiconductor laser 100 in the laser resonator length direction.

Figure 2:
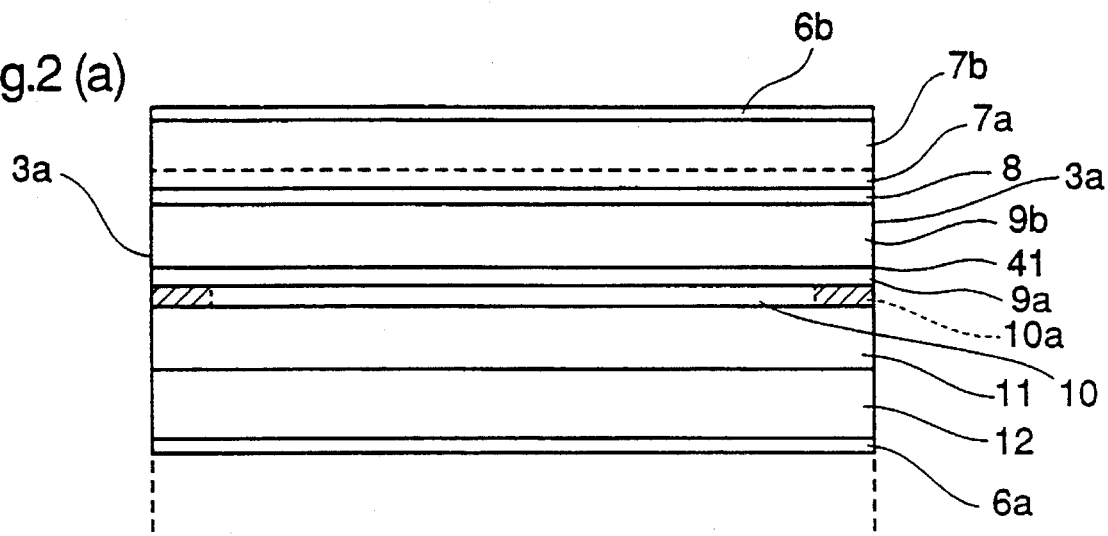
FIG. 2(a) is a cross-sectional view in the laser resonator length direction illustrating the structure of a semiconductor laser according to the first embodiment of the present invention and FIG. 2(b) is a diagram showing the energy band gap of the semiconductor laser.
Figure 2:
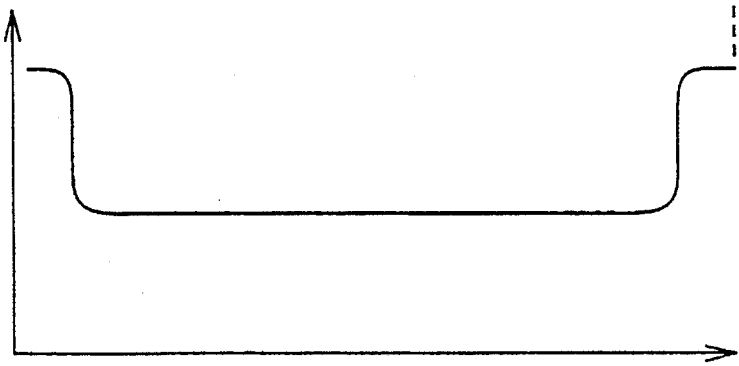
Figure 16:
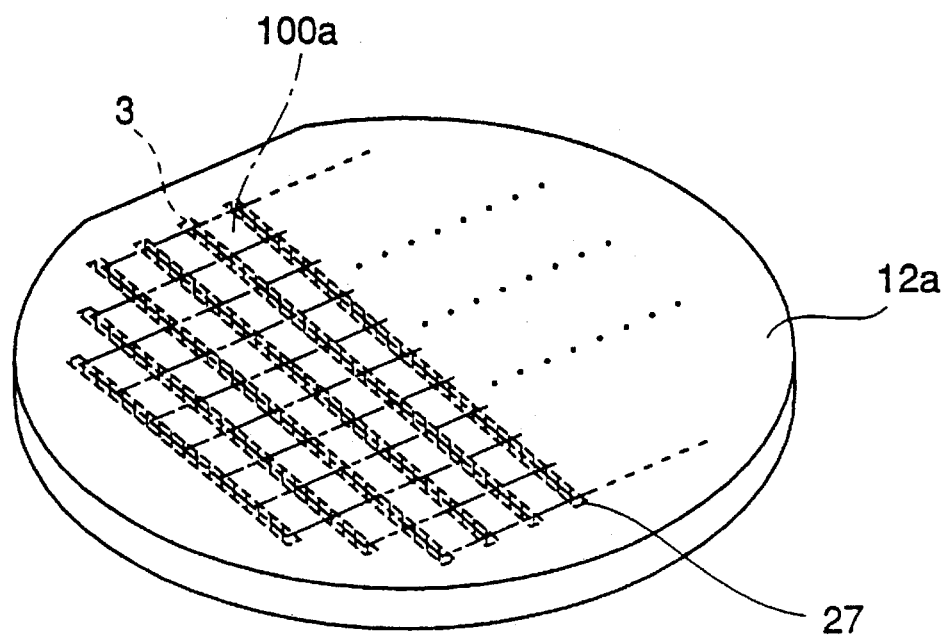
FIG. 16 is a perspective view illustrating the main process of the method of fabricating a semiconductor laser according to another modification of the first embodiment of the present invention.
Figure 17:
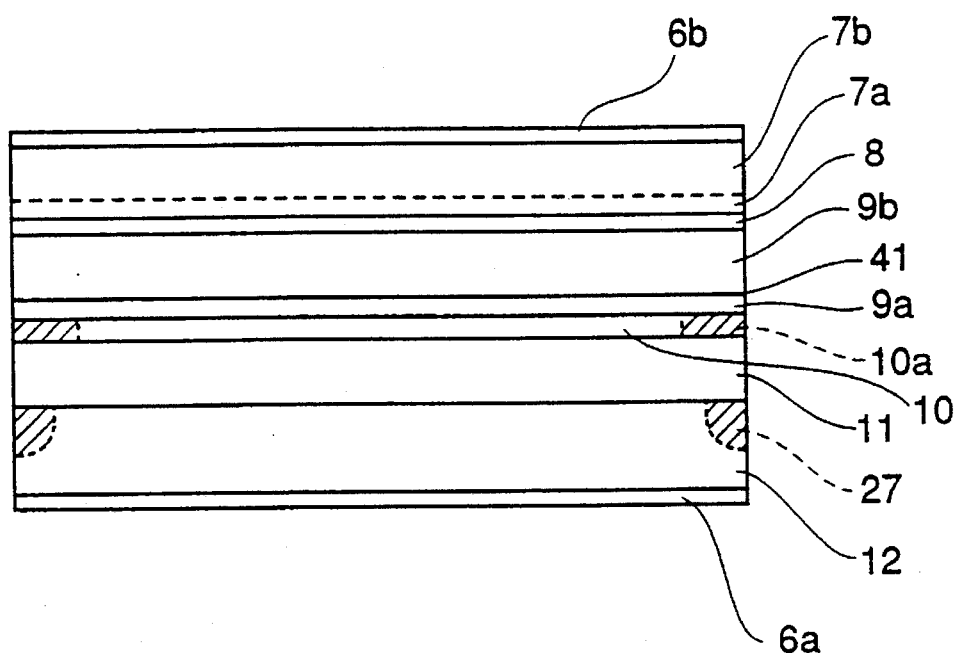
FIG. 17 is a cross-sectional view illustrating the main process of the method of fabricating a semiconductor laser according to another modification of the first embodiment of the present invention.

Furthermore, as shown in FIG. 16, an impurity can be introduced into the laser resonator facet proximity region 3 of multiple neighboring semiconductor laser elements in a forming region 100a of the wafer 12a to a prescribed depth by diffusion or ion implantation, thereby forming a conductivity type inversion region 27 of a band shape having a conductivity type opposite to that of the wafer 12a. Electrodes (not shown in the figure) can be installed on both sides of the inversion region 27 and, by flowing current through the inversion region 27, heat can be produced so that the growth temperature in this inversion region 27 when forming the active layer 10 is made higher than that of the active layer 10 in the region other than the laser resonator facet proximity region. Even in this case, a similar effect as in the first embodiment can be obtained. The cross-section of the semiconductor laser 100 formed by a method such as this and having the inversion region 27 in the laser resonator length direction is shown in FIG. 17. Since the p type AlGaInP cladding layer 9a, the n type AlGaInP cladding layer 11, the conductivity type inversion region 27 of the n type GaAs substrate 12, and the n type GaAs substrate 12 make a pnpn junction in the proximity of the laser resonator facet, leakage current which does not contribute to light emission and flows through the region in the proximity of the laser resonator facet where the window structure 10a is formed can be perfectly prevented, and the performance of the semiconductor laser is improved. In FIG. 17, the same reference numerals used in FIG. 2 are to designate the same or corresponding parts.

Figure 18:
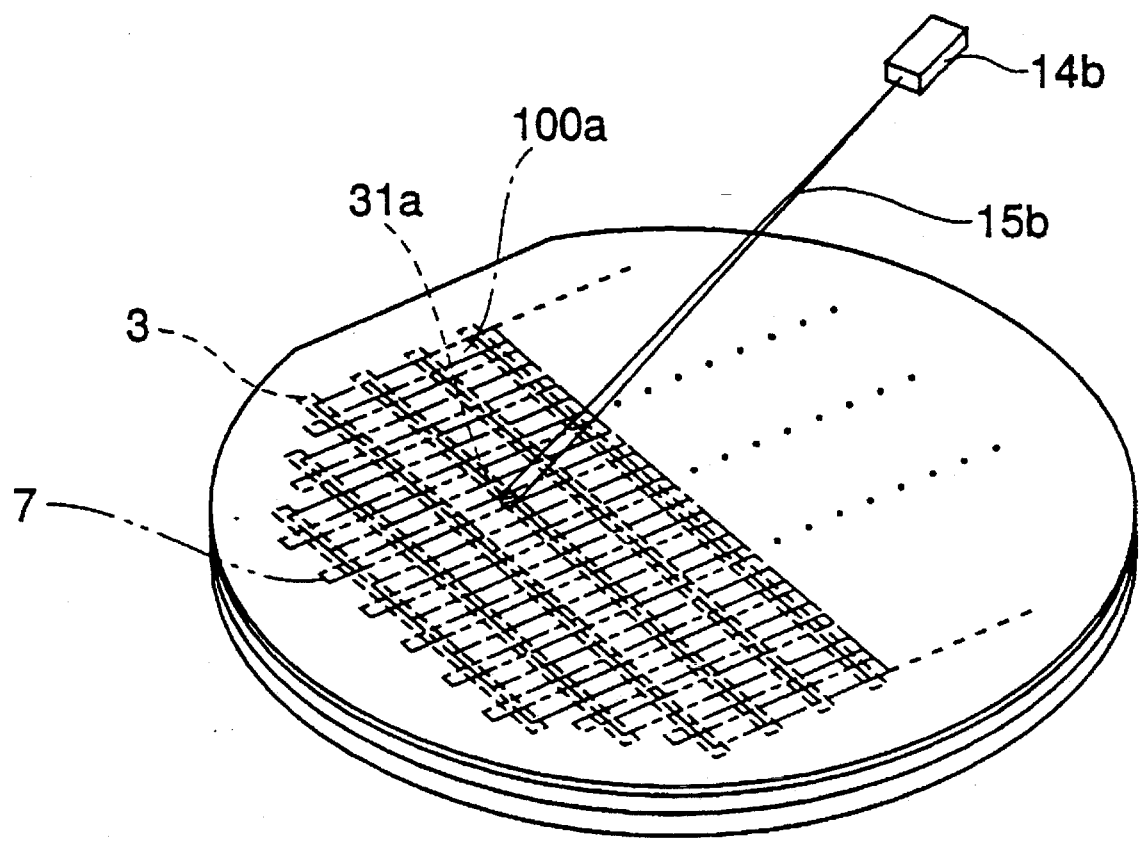
FIG. 18 is a perspective view illustrating the main process of the method of fabricating a semiconductor laser according to another modification of the first embodiment of the present invention.

In the first embodiment of the present invention, the window structure 10a is formed by heating the laser resonator facet proximity region 3 of the semiconductor laser forming region 100a. However, since in the present invention, it is only necessary to form the window structure on a waveguide in the proximity of the laser resonator facet, only the proximity region of the ridge stripe forming region 7 where the ridge stripe is formed in the laser resonator facet proximity region 3 needs to be heated, thereby forming the window structure in this region of the active layer 10 when forming the active layer 10. For example, a laser device 14b emitting a laser light 15b whose irradiation region 31a has a circular or oblong shape can be used as a means of heating. By irradiation with the laser light 15b emitted from this laser device, the laser resonator facet proximity region 3 in the proximity of the ridge stripe forming region 7 is heated as shown in FIG. 18, and even in this case, a similar effect as in the first embodiment can be obtained.

Embodiment 2

Figure 7:
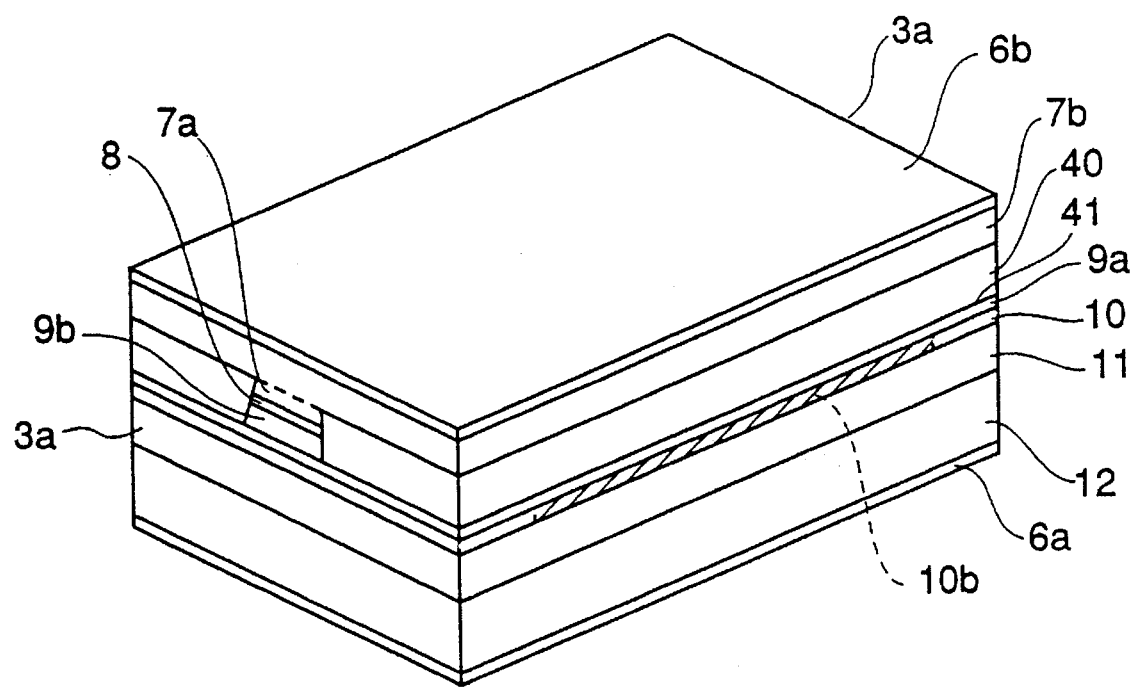
FIG. 7 is a perspective view illustrating the structure of a semiconductor laser according to a second embodiment of the present invention.

FIG. 7 is a perspective view illustrating a structure of a semiconductor laser according to a second embodiment of the present invention. In the figure, the same reference numerals used in FIG. 1 are to designate the same or corresponding parts and reference numeral 10b designates the region of the active layer 10 which is irradiated with a laser light 15.

Figure 8:
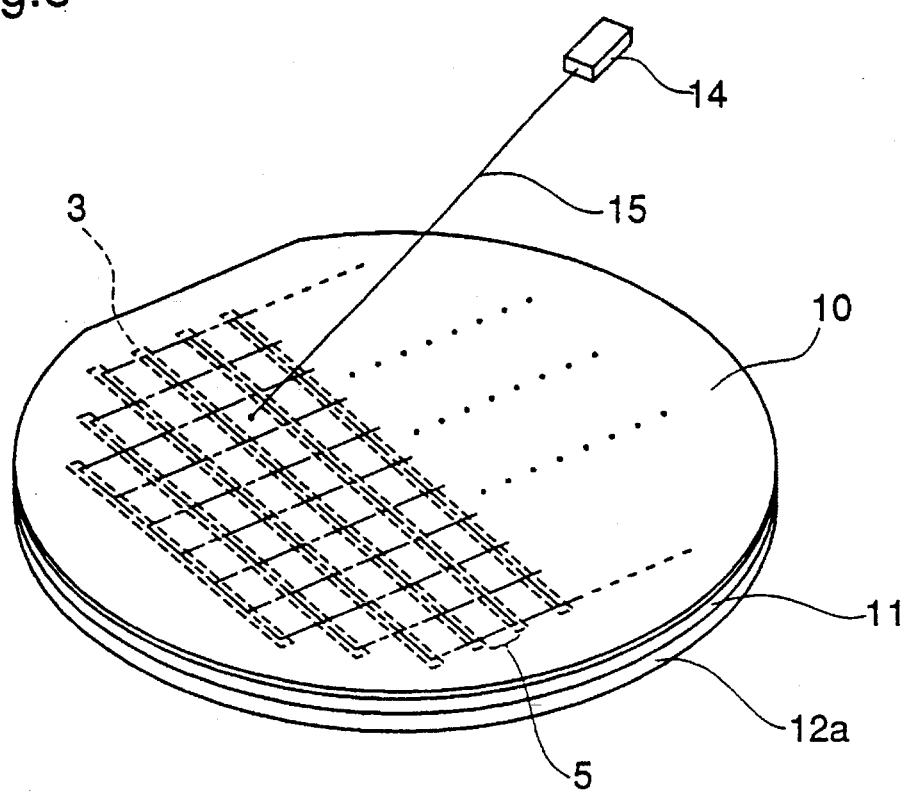
FIG. 8 is a perspective view illustrating the main process of the method of fabricating the semiconductor laser according to the second embodiment of the present invention.

FIG. 8 is a perspective view illustrating the main process of the method of fabricating a semiconductor laser according to the second embodiment of the present invention. In the figure, the same reference numerals used in FIGS. 3(a)–3(f) designate the same or corresponding parts and reference numeral 5 designates a region of the semiconductor laser 100a other than the laser resonator facet proximity region.

Usually, successive epitaxial growth processes are conducted at almost constant temperature. However, in an AlGaInP/GaInP series semiconductor lasers, if, for example, GaInP is used as the active layer and the growth temperature is high, then In is easily evolved during the growth process of the active layer, the homogeneity of the composition is deteriorated and, consequently, the lattice match is lost due to the evolution of In, thereby making it hard to maintain the inner homogeneity of the energy band gap.

On the other hand, if the growth temperature is low and, for example, AlGaInP is used as the cladding layer, then it easily takes in oxygen. In particular, for a p type cladding layer, this results in a decrease in the carrier concentration with respect to the dopant concentration. As a means of solving these problems, a method in which the growth temperature during the active layer growth is lower than that during the cladding layer growth has been attempted.

The fabricating method described as the first embodiment can be applied to these cases in which the growth temperature for the active layer is lower than that of the cladding layer. By applying the fabricating method of the first embodiment, a semiconductor laser having a window structure can easily be obtained with a good yield. However, since in the first embodiment it was necessary that the epitaxial growth temperature for the active layer be greater than the temperature at which the PL wavelength of the active layer is maximized and that the laser resonator facet proximity region be heated with the laser light, the growth temperature for the active layer could not be made lower than the growth temperature at which the PL wavelength was maximized.

The fabricating method according to the second embodiment of the present invention solves these problems. A semiconductor laser having a window structure can easily be obtained with a good yield when the growth temperature of the active layer is made lower than the growth temperature at which the PL wavelength of the active layer is maximized. The epitaxial growth temperature of the active layer is made lower than the growth temperature at which the PL wavelength of a material constituting the active layer is maximized, and the regions other than the laser resonator facet proximity region are heated by a laser light such that the growth temperature of this region is made lower than the temperature at which the PL wavelength of the material constituting the active layer is maximized, thereby obtaining the window structure.

Next, the fabricating method will be described with reference to FIG. 7. First, as in the first embodiment of the present invention, after the n type AlGaInP cladding layer 11 is epitaxially grown on the wafer 12a, the GaInP active layer 10 is epitaxially grown. When growing the active layer 10, the growth temperature for the active layer 10 is made lower than the growth temperature at which the PL wavelength of the GaInP layer is maximized and, as shown in FIG. 8, the region 5 of the wafer 12a other than the laser resonator facet proximity region is scanned with the laser light 15 so that the active layer 10 on this region is heated to a temperature higher than that of the laser resonator facet proximity region 3 but lower than the growth temperature at which the PL wavelength of the GaInP layer is maximized. The length of this region irradiated with the laser light in the resonator length direction and the length of the laser resonator facet proximity region 3 in the laser resonator length direction are, for example, 610 μm and 40 μm, respectively, as in the first embodiment.

Here, from the relationship between the growth temperature and the PL wavelength for the GaInP layer which lattice-matches with the GaAs substrate, it can be seen that below the growth temperature at which the PL wavelength is maximized, for example 655° C, the higher the growth temperature is, the longer the PL wavelength, and the energy band gap becomes small in the region of high growth temperature. Therefore, due to this nature, as described above, when the GaInP active layer is grown, if the active layer 10 is grown at a growth temperature lower than the growth temperature at which the PL wavelength of the GaInP layer is maximized, for example 655° C. or below, and if, as illustrated in FIG. 8, the region of the active layer 10 on the wafer 12a other than the laser resonator facet proximity region 3 is scanned with a point shape laser light 15, then the GaInP is epitaxially grown while it is heated more in the irradiated region 10b irradiated with the laser light 15 than in the other region, and the energy band gap of the GaInP layer in the heated region becomes smaller than that of the GaInP layer other than in the laser resonator facet proximity region 3. For example, if the growth temperature of the region which is being scanned with the laser light 15 is set to 630° C. and the active layer 10 is epitaxially grown such that the temperature difference between the region scanned with the laser light and other region is about 20° C., then the energy band gap difference becomes about 17 meV. Therefore, the energy band gap of the region irradiated with the laser light becomes smaller than the energy band gap of the other region of the active layer, which is, the laser resonator facet proximity region 3, and the active layer 10 in the laser resonator facet proximity region 3 which is not irradiated with the laser light becomes the window structure.

Then, by fabricating processes similar to those used for the first embodiment after the formation of the active layer 10, the semiconductor laser 100 having the ridge stripe as illustrated in FIG. 7 is obtained.

In the second embodiment, as in the first embodiment, in a process of growing the active layer 10, by irradiating the region 5 other than the laser facet proximity region with the laser light 15, the energy band gap of the active layer 10 of the laser resonator facet proximity region 3 can be made larger than the energy band gap of the region 10b of the region 5 other than the laser resonator facet proximity region which is irradiated with the laser light 15, and the window structure which does not absorb laser light can be formed at the active layer 10 in the proximity of the laser resonator facet 3a. Therefore, a semiconductor laser having desired characteristics can be easily formed with great repeatability.

Furthermore, since the active layer 10 is grown at a temperature below the growth temperature at which the PL wavelength of a material constituting the active layer 10 is maximized, the active layer can be grown at a temperature below the temperature used in the method of fabricating the semiconductor laser of the first embodiment, and a semiconductor laser having better characteristics can be obtained.

Figure 19:
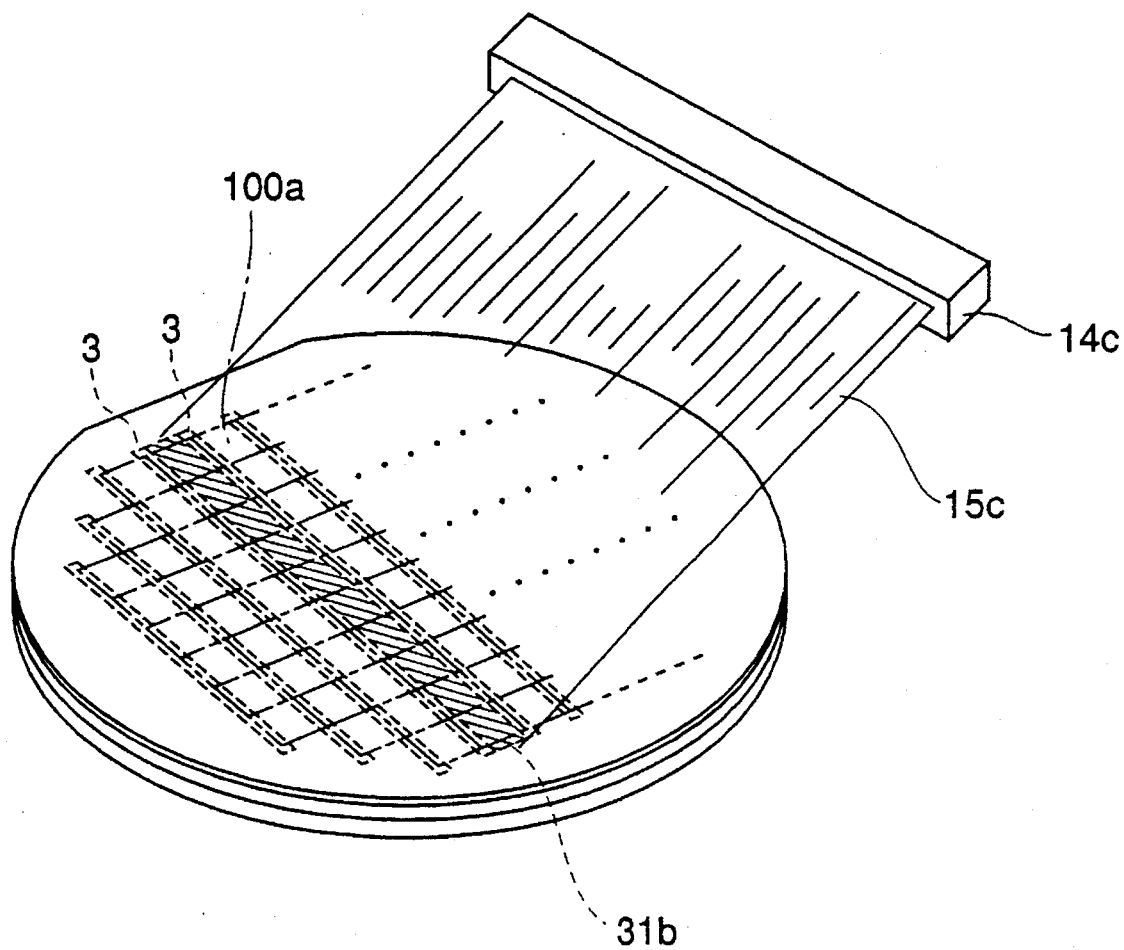
FIG. 19 is a perspective view illustrating the main process of the method of fabricating a semiconductor laser according to a modification of the second embodiment of the present invention.

While, in the second embodiment of the present invention, when the active layer 10 in the region 5, other than the laser resonator facet proximity region, is being heated, the laser device 14 which emits the laser light 15 in a point shape is used, in this invention, a laser device which has an irradiation region of a different shape can be used. For example, as shown in FIG. 19, an array type semiconductor laser which emits laser light 15c spreading in a band shape along the region 5 other than the laser resonator facet proximity region producing irradiation region 31b can be used, and the irradiation region 31b of the laser light is superimposed on the region 5 other than the laser resonator facet proximity region. Even in this case, a similar effect as in the second embodiment can be obtained, and since the laser device 14c does not require the scanning mechanism of the laser device 14 of the second embodiment, a semiconductor laser can be formed using an inexpensive laser device having a simple structure. In FIG. 19, the same reference numerals used in FIG. 8 designate the same or corresponding parts.

Furthermore, in the second embodiment of the present invention, by making the scanning cycle of the point shape laser light 15 during epitaxial growth of the active layer 10 equal to or less than the time required for the active layer 10 to grow by one monolayer, the active layer 10 of the region 5 other than the laser resonator facet proximity region can be formed while the growth surface is heated uniformly for each monolayer, and the energy band gap of the laser light irradiated region 10b of the active layer 10 can be made uniform and a semiconductor laser of better characteristics is obtained.

Furthermore, usually in a method of fabricating a semiconductor laser, a marker for aligning a ridge stripe to a cleavage position is formed on the wafer before or after the formation of the ridge stripe. Since, in the second embodiment of the present invention, it is necessary to align the region of the active layer 10 which is heated with the laser light 15 to the ridge stripe, as illustrated in the first embodiment with reference to FIG. 10, the marker for alignment can be formed by etching or the like on the wafer 12a before the formation of the active layer 10. By forming this marker, the precision of the alignment of the region heated with the laser light 15 to the ridge stripe can be improved, thereby improving the yield of the semiconductor lasers.

Furthermore, while, in the second embodiment of the present invention, the region 5 of the active layer 10 other than the laser resonator facet proximity region is heated with the laser light, light which is radiated from light sources such as an IR lamp or a halogen lamp and is focused through a lens can be used as a means of heating instead of the laser light used in the second embodiment. This focused light irradiates the region 5 other than the laser resonator facet proximity region to heat it. Even in a case such as this, a similar effect as in the second embodiment can be obtained.

Figure 20:
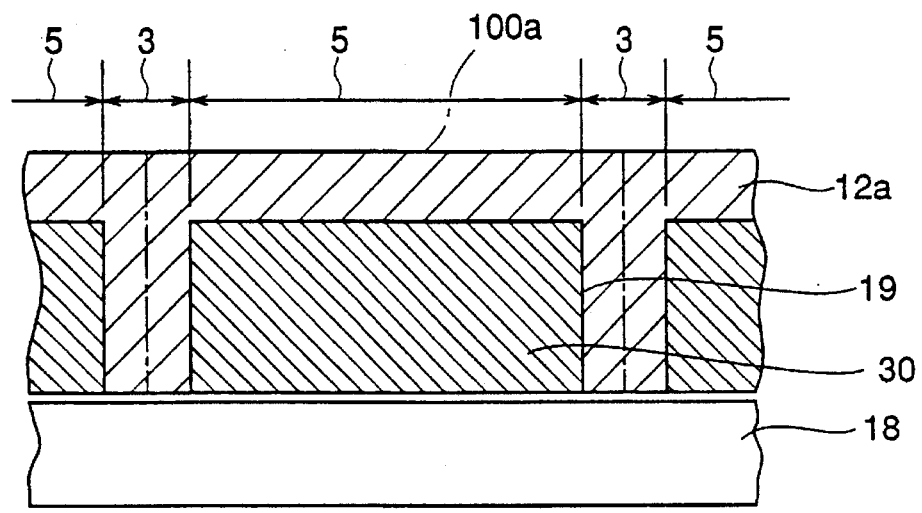
FIG. 20 is a cross-sectional view illustrating the main process of the method of fabricating a semiconductor laser according to another modification of the second embodiment of the present invention.

In the second embodiment of the present invention, the region of the semiconductor laser forming region 100a other than the laser resonator facet proximity region is heated by irradiation with the laser light 15. However, when a substrate heater which heats the wafer from the rear surface is used as a growth apparatus of a semiconductor laser, as illustrated in FIG. 20, which is a cross-section of the wafer 12a which forms the semiconductor laser 100 in the laser resonator length direction, the rear surface side of the region 5 of the semiconductor laser element forming region 100a of the wafer 12a other than the laser resonator facet proximity region can be removed by etching to a prescribed depth, thereby forming a recess 19. By filling the recess 19 with AlN, BN, or the like which has a thermal conductivity higher than that of the substrate 12a and forming a high thermal conductivity layer 30, the thermal conduction from the heating body to the growth surface of the region 5 other than the laser resonator facet proximity region can be facilitated, thereby making a temperature on the surface of the region 5 other than the laser resonator facet proximity region difficult to reduce. The temperature on the growth surface of the region 5 other than the laser resonator facet proximity region is made higher than that of the laser resonator facet proximity region, and the growth temperature of the active layer 10 formed in the laser resonator facet proximity region is lower than that of the active layer 10 in the region 5 other than the laser resonator facet proximity region. Even in a case such as this, a similar effect as in the second embodiment can be obtained. Since a growth apparatus including a laser device as described for the second embodiment does not have to be used as a fabricating apparatus, and a semiconductor laser having a window structure can be obtained using the prior art MOCVD apparatus, the semiconductor laser having the window structure can be obtained more easily than in the method of fabricating a semiconductor laser according to the first embodiment.

Figure 21:
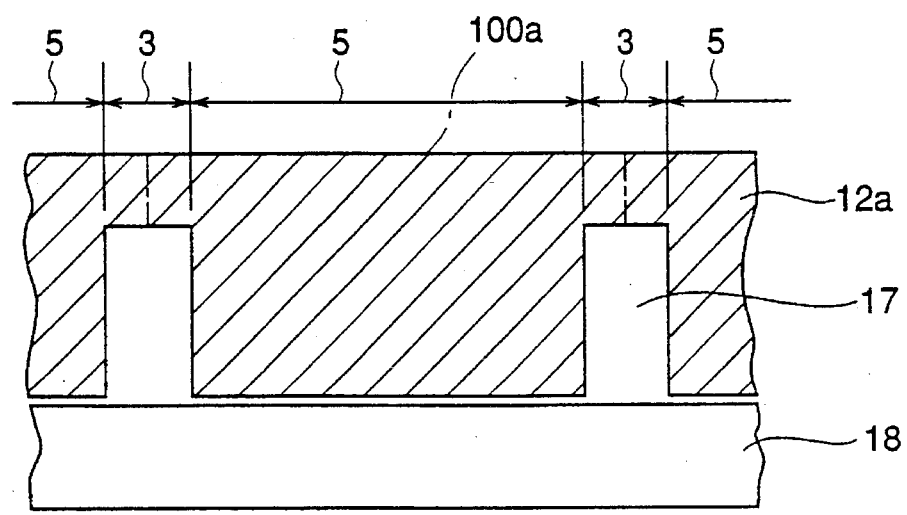
FIG. 21 is a cross-sectional view illustrating the main process of the method of fabricating a semiconductor laser according to another modification of the second embodiment of the present invention.

Furthermore, as in FIG. 20, by forming a recess 17 by etching on the rear surface side of the laser resonator facet proximity region 3 as illustrated in FIG. 21, thereby increasing the thermal conductivity between the region 5 other than the laser resonator facet proximity region and the heating body, the growth temperature of the active layer forming at the region 5 other than the laser resonator facet proximity region can be made higher than the growth temperature of the active layer in the laser resonator facet proximity region 3. Even in a case such as this, a similar effect as in the first embodiment can be obtained.

Figure 22:
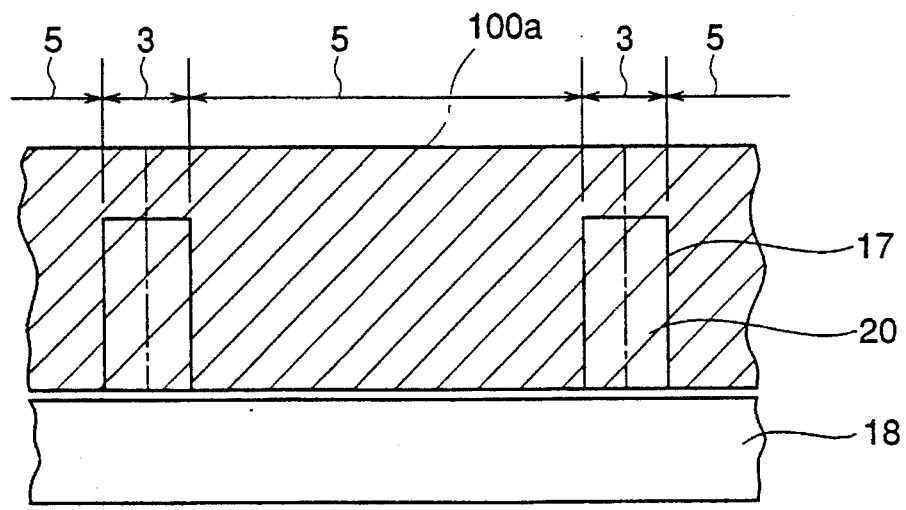
FIG. 22 is a cross-sectional view illustrating the main process of the method of fabricating a semiconductor laser according to another modification of the second embodiment of the present invention.

Furthermore, as illustrated in FIG. 22, by filling the recess 17 of the wafer 12a illustrated in FIG. 21 with a material whose thermal conductivity is smaller than that of the wafer 12a, such as $SiO_2$, or the like such that the low thermal conductivity layer 20 is formed, and by forming the semiconductor laser using this wafer 12a, the growth temperature of the region 5 of the active layer 10 other than the laser resonator facet proximity region can be made higher than the growth temperature of the laser resonator facet proximity region 3. Even in a case such as this, a similar effect as in the first embodiment can be obtained.

Figure 23:
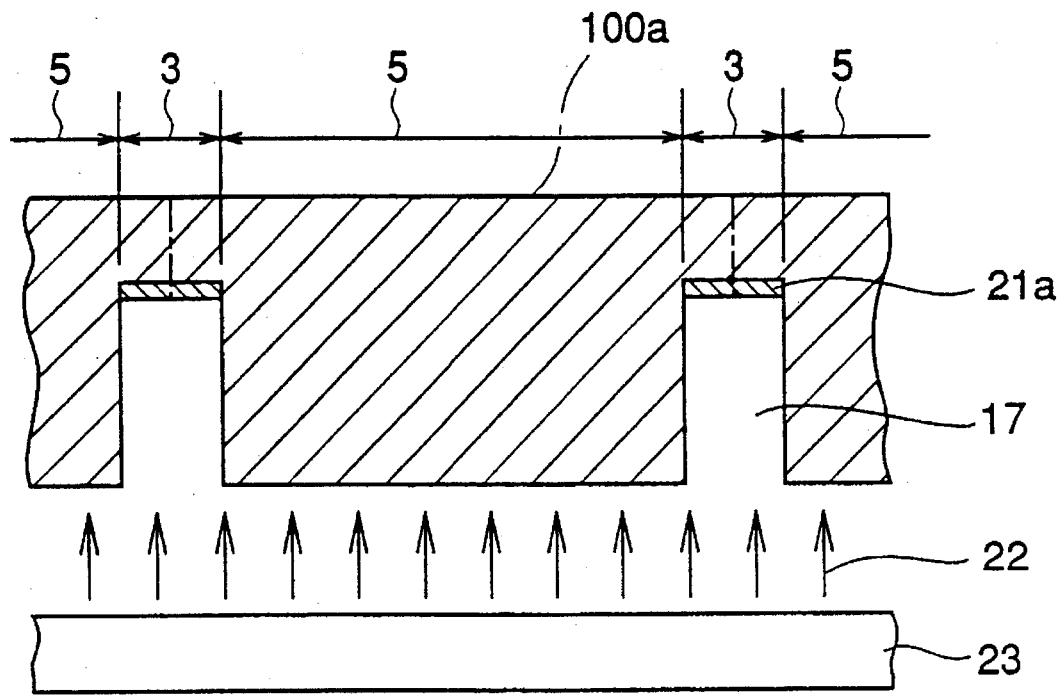
FIG. 23 s a cross-sectional view illustrating the main process of the method of fabricating a semiconductor laser according to another modification of the second embodiment of the present invention.

In addition, when the substrate heater which heats the wafer from its rear surface with light emitted from a light source 23, such as an IR lamp or a halogen lamp, as a fabrication apparatus for the semiconductor laser, as illustrated in FIG. 23, the recess 17 can be formed by etching to a desired depth on the rear surface side of the laser resonator facet proximity region 3 of the wafer 12a. A single layer or multiple layers of thin films comprising a material whose permeability varies with varying thickness such as SiO, SION, SiN, $Al_2O_3$, or the like can be formed with such a thickness that the reflectivity of the light emitted from the IR lamp or the halogen lamp becomes greater than that of the wafer 12a. The light 22 from the light source 23 is reflected from the high reflectivity film 21a, and the absorption of light energy in the laser resonator facet proximity region 3 is reduced, thereby making the growth temperature of the active layer 10 formed in the region 5 other than the laser resonator facet proximity region higher than that of the active layer in the laser resonator facet proximity region 3. Even in a case such as this, a similar effect as in the second embodiment can be obtained, and since the growth apparatus including a laser device described for the second embodiment does not have to be used as a fabricating apparatus for a semiconductor device and a semiconductor laser having a window structure is obtained using a prior art MOCVD apparatus, a semiconductor laser having a window structure can be obtained more easily than by the method of fabricating a semiconductor laser according to the first embodiment. FIG. 23 is a cross-sectional view of the wafer 12a which forms a semiconductor laser 100 in the laser resonator length direction. In the figure, reference numerals used in FIGS. 14 and 15 designate the same or corresponding parts.

Figure 24:
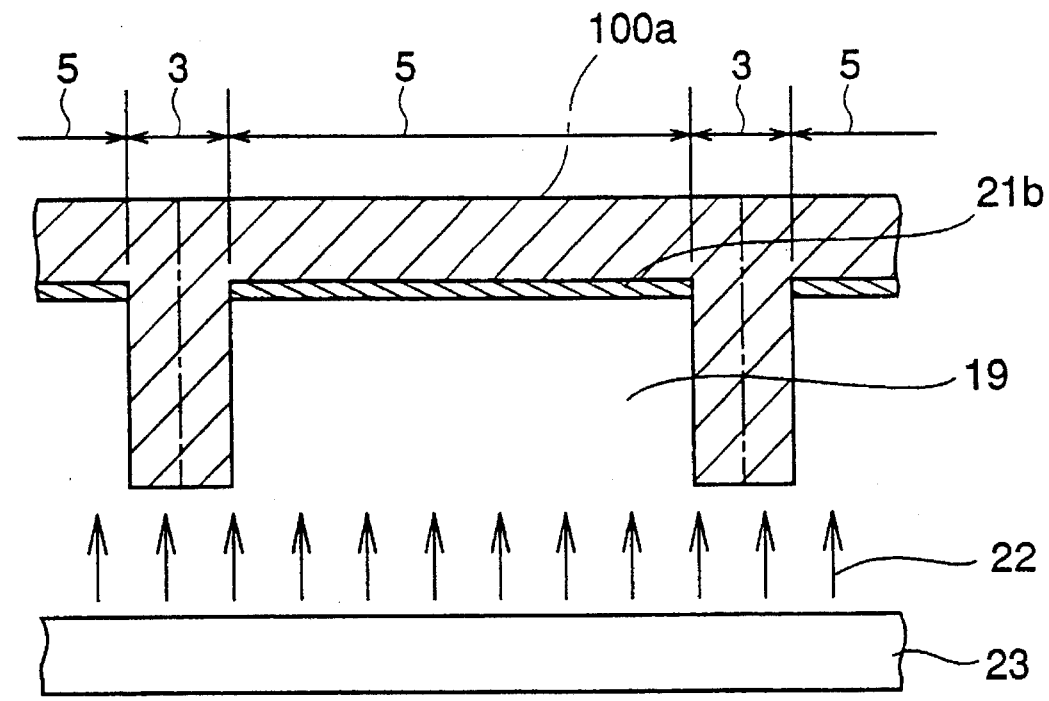
FIG. 24 is a cross-sectional view illustrating the main process of the method of fabricating a semiconductor laser according to another modification of the second embodiment of the present invention.

Furthermore, as shown in FIG. 24, the recess 19 can be formed on the rear surface side of the region 5 of the wafer 12a other than the laser resonator facet proximity region by etching to a prescribed depth. A single layer or multiple layers of thin films comprising a material such as SiO, SION, SiN, or $Al_2O_3$ can be formed by evaporation or the like on the bottom surface of the recess 19 with such a thickness that its reflectivity to light emitted from a light source such as an IR lamp or a halogen lamp becomes smaller than that of the wafer 12a. The reflection of light from the light source 23 is reduced by the low reflectivity film 21b, and the absorption of light energy in the region 5 on a wafer 12a other than the laser resonator facet proximity region is increased, thereby making the growth temperature of the active layer 10 formed in the region 5 other than the laser resonator facet proximity region higher than that of the active layer 10 in the laser resonator facet proximity region. Even in a case such as this, a similar effect as in the second embodiment can be obtained. FIG. 24 is a cross-sectional view of the wafer 12a which forms the semiconductor laser 100 in the laser resonator length direction. In the figure, the same reference numerals used in FIGS. 14 and 15 designate the same or corresponding parts.

Figure 25:
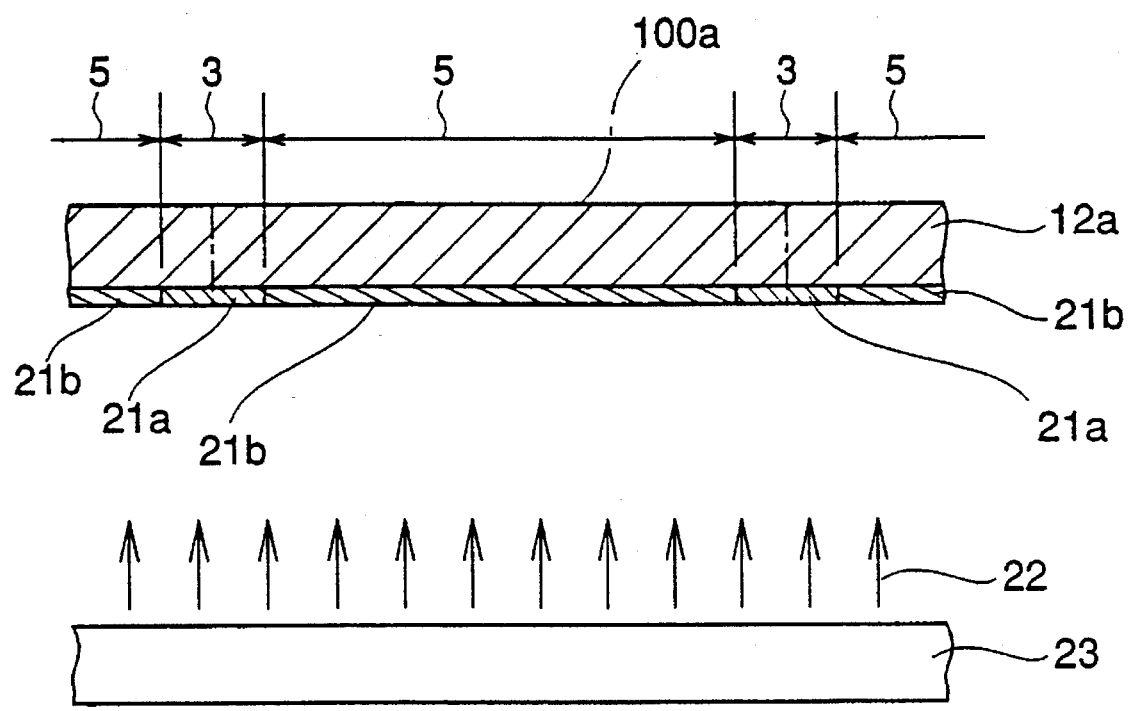
FIG. 25 is a cross-sectional view illustrating the main process of the method of fabricating a semiconductor laser according to another modification of the second embodiment of the present invention.

Furthermore, as shown in FIG. 25, the rear surface side of the laser resonator facet proximity region 3 of the semiconductor laser element forming region of the wafer 12a and the rear surface side of the region 5 other than the laser resonator facet proximity region can be removed to a prescribed depth by etching or the like. By forming the high reflectivity film 21a on the rear surface of the laser resonator facet proximity region 3 of the wafer and the low reflectivity film 21b on the rear surface of the region 5 other than the laser resonator facet proximity region, the high reflectivity film 21a reflecting the light 22 emitted from the light source 23 and the low reflectivity film 21b reducing the reflection of the light 22 emitted from the light source 23, the absorption of light energy in the region 5 of the wafer other than the laser resonator facet proximity region can be made larger than the absorption of the light energy in the laser resonator facet proximity region. Thus, the growth temperature of the active layer 10 formed in the region 5 other than the laser resonator facet proximity region is higher than that of the active layer 10 in the laser resonator facet proximity region 3. Even in a case such as this, a similar effect as in the second embodiment can be obtained.

Figure 26:
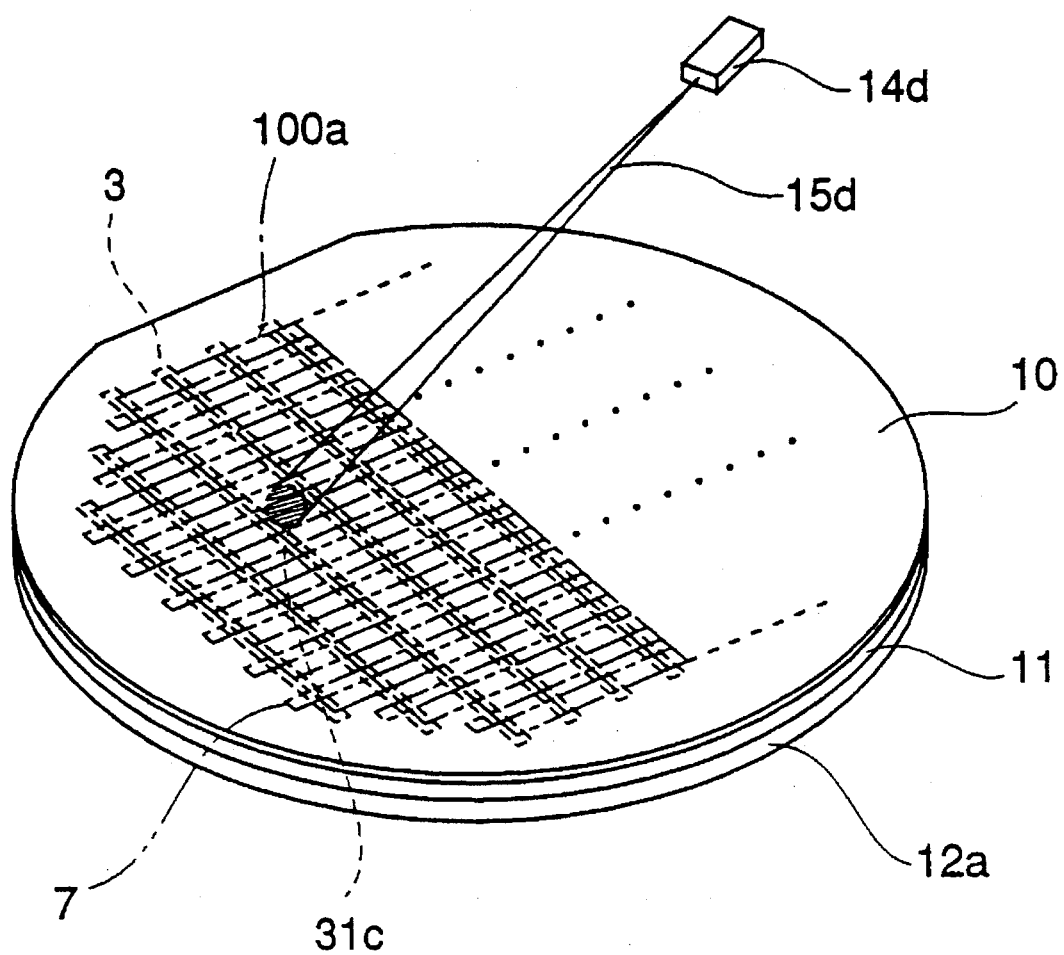
FIG. 26 is a perspective view illustrating the main process of the method of fabricating a semiconductor laser according to another modification of the second embodiment of the present invention.

Furthermore, while, in the second embodiment of the present invention, the region 5 other than the laser resonator facet proximity region is heated, the present invention only requires that the active region including at least the light emitting part of the semiconductor laser, that is, the active layer in a region including a light emitting part, which is the sub-region of the ridge stripe outside the laser resonator facet proximity region, be formed such that its energy band gap is smaller than that of the window structure formed in the laser resonator facet proximity region on the waveguide of the semiconductor laser. By heating only the active layer in the proximity of a region, which becomes a sub-region of the ridge stripe in a region outside of the proximity of the laser resonator facet, the energy band gap of the active layer in this region can be made smaller than that of the active layer in the other region, thereby forming the active region. For example, when a laser device is used as a means of heating, as shown in FIG. 26, the proximity of the region 7, where the ridge stripe is formed, to the region except the laser resonator facet proximity region can be heated by using a laser device 14d which emits laser light having an oblong irradiation region or by the laser light 15d having a circular irradiation region. Even in a case such as this, a similar effect as in the second embodiment can be obtained. In FIG. 26, the same reference numerals used in FIG. 18 are to designate the same or corresponding parts.

In the first and second embodiments, a GaInP layer is used as the active layer, the present invention can also be applied to a semiconductor laser using any compound semiconductor which the PL wavelength increases monotonically with an increase in growth temperature until a certain temperature is reached and decreases monotonically with an increase in temperature past that temperature. In other words, the energy band gap decreases monotonically until that temperature is reached and increases monotonically past that temperature. For example, the present invention can be applied to a semiconductor laser in which a III–V semiconductor material having more than two kinds of group III elements is used as an active layer. Even in a case such as this, a similar effect can be obtained.

While, in the first and second embodiments, cases in which the active layer comprises a single layer are described, the present invention can be applied to cases in which the active layer employs other structures such as a multi-quantum well structure or a strained multi-quantum well structure. Even in a case such as this, a similar effect can be obtained.

While, in the first and second embodiments, AlGaInP/GaInP series semiconductor lasers are described, the present invention can be applied to semiconductor lasers comprising other materials. Even in a case such as this, a similar effect can be obtained.

What is claimed is:

1. A method of fabricating a semiconductor laser comprising:
   preparing a semiconductor substrate having a front surface and a rear surface; and
   forming an active layer comprising a compound semiconductor material on the front surface of the semiconductor substrate, the compound semiconductor material having a band gap energy that monotonically increases as growth temperature rises above a certain growth temperature, forming of the active layer being conducted at a temperature above the certain growth temperature so that a window structure forming region including at least a region that serves as a waveguide in the proximity of a laser resonator facet has a higher temperature than a region outside the window structure forming region and, therefore, the window structure forming region has a larger band gap energy than the region outside the window structure forming region.

2. The method of claim 1 wherein the active layer comprises GaInP.

3. The method of claim 1 including, while forming the active layer, irradiating the window structure forming region of the active layer with laser light so that the window structure forming region is heated to a temperature higher than the region outside the window structure forming region.

4. The method of claim 3 wherein the laser light has a point shape in a plane and including scanning the point shape laser light along the window structure forming region while forming the active layer.

5. The method of claim 4 wherein a scanning cycle of the laser light is no longer than the time needed to grow one monolayer of the active layer.

6. The method of claim 3 wherein the laser light has a shape in a plane that is the same as the window structure forming region including superimposing the laser light on the window structure forming region while forming the active layer.

7. The method of claim 1 including, while forming the active layer, irradiating the window structure forming region of the active layer with light so that the window structure forming region is heated to a temperature higher than the region of the active layer outside the window structure forming region.

8. The method of claim 1 comprising:
   before forming the active layer, forming a recess by etching the rear surface of the semiconductor substrate opposite the window structure forming region;
   filling the recess with a material having a thermal conductivity higher than that of the semiconductor substrate, thereby forming a high thermal conductivity layer; and
   while forming the active layer, heating the semiconductor substrate at the rear surface.

9. The method of claim 1 comprising:
   forming a recess by etching the rear surface of the semiconductor substrate opposite the region of the semiconductor substrate outside the window structure forming region before forming the active layer; and
   forming the active layer while heating the semiconductor substrate from the rear surface.

10. The method of claim 9 comprising, before forming the active layer, filling the recess with a material having a thermal conductivity lower than that of the semiconductor substrate, thereby forming a low thermal conductivity layer.

11. The method of claim 1 comprising:
    before forming the active layer, forming a recess by etching the rear surface of the semiconductor substrate opposite the window structure forming region;
    forming a low reflectivity film having a reflectivity lower than that of the semiconductor substrate in the recess; and
    forming the active layer while heating the semiconductor substrate with a light source from the rear surface.

12. The method of claim 1 comprising:
    before forming the active layer, forming a recess by etching the rear surface of the semiconductor substrate opposite the region outside the window structure forming region;
    forming a high reflectivity film having a reflectivity higher than that of the semiconductor substrate in the recess; and
    forming the active layer while heating the semiconductor substrate with a light source from the rear surface.

13. The method of claim 1 comprising:
    forming an inversion region having a conductivity type opposite that of the semiconductor substrate by introducing a dopant impurity into the window structure forming region of the semiconductor substrate;
    forming the active layer so that the window structure forming region of the active layer is heated to a temperature higher than the region of the active layer outside the window structure forming region by passing a current through the inversion region.

14. The method of claim 1 wherein the semiconductor substrate is a wafer having a front surface, the method comprising forming a marker for alignment in a region on the front surface of the wafer and using the marker for alignment in subsequent steps after forming the active layer.

15. A method of fabricating a semiconductor laser comprising:
    preparing a semiconductor substrate having a front surface and a rear surface; and
    forming an active layer comprising a compound semiconductor material on the front surface of the semiconductor substrate, the compound semiconductor material having a band gap energy that monotonically decreases as growth temperature falls below a certain growth temperature, forming of the active layer being conducted at a temperature below the certain growth temperature so that an active region including at least a light emitting region that contributes to light emission but not including a laser resonator facet proximity region is at a higher temperature than a region outside the active region and, therefore, the active region has a smaller band gap energy than the region outside the active region.

16. The method of claim 15 wherein the active layer comprises GaInP.

17. The method of claim 15 including, while forming the active layer, irradiating the active region of the active layer with laser light so that the active region is heated to a temperature higher than the region outside the active region.

18. The method of claim 17 wherein the laser light has a point shape in a plane and including scanning the point shape laser light along the active region while forming the active layer.

19. The method of claim 18 wherein a scanning cycle of the laser light is no longer than the time needed to grow one monolayer of the active layer.

20. The method of claim 17 wherein the laser light has a shape in a plane that is the same as the active region including superimposing the laser light on the active region while forming the active layer.

21. The method of claim 15 including, while forming the active layer, irradiating the active region with light so that the active region is heated to a temperature higher than the region outside the active region.

22. The method of claim 15 comprising:
 before forming the active layer, forming a recess by etching the rear surface of the semiconductor substrate opposite the active region;
 filling the recess with a material having a thermal conductivity higher than that of the semiconductor substrate, thereby forming a high thermal conductivity layer; and
 while forming the active layer, heating the semiconductor substrate at the rear surface.

23. The method of claim 15 comprising:
 forming a recess by etching the rear surface of the semiconductor substrate opposite the region of the semiconductor substrate outside the active region before forming the active layer; and
 forming the active layer while heating the semiconductor substrate from the rear surface.

24. The method of claim 23 comprising, before forming the active layer, filling the recess with a material having a thermal conductivity lower than that of the semiconductor substrate, thereby forming a low thermal conductivity layer.

25. The method of claim 15 comprising
 before forming the active layer, forming a recess by etching the rear surface of the semiconductor substrate opposite the active region;
 forming a low reflectivity film having a reflectivity lower than that of the semiconductor substrate in the recess; and
 forming the active layer while heating the semiconductor substrate with a light source from the rear surface.

26. The method of claim 15 comprising:
 before forming the active layer, forming a recess by etching the rear surface of the semiconductor substrate opposite the region outside the active region;
 forming a high reflectivity film having a reflectivity higher than that of the semiconductor substrate in the recess; and
 forming the active layer while heating the semiconductor substrate with a light source from the rear surface.

27. The method of claim 15 wherein the semiconductor substrate is a wafer having a front surface, the method comprising forming a marker for alignment in a region on the front surface of the wafer, and using the marker for alignment in subsequent steps after forming the active layer.

* * * * *